United States Patent
Park et al.

(10) Patent No.: US 10,533,127 B2
(45) Date of Patent: Jan. 14, 2020

(54) COMPOSITIONS, QUANTUM DOT POLYMER COMPOSITE AND LAYERED STRUCTURE PRODUCED THEREFROM, AND ELECTRONIC DEVICE INCLUDING THE SAME

(71) Applicant: SAMSUNG ELECTRONICS CO., LTD., Suwon-si, Gyeonggi-do (KR)

(72) Inventors: Shang Hyeun Park, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/104,597

(22) Filed: Aug. 17, 2018

(65) Prior Publication Data
US 2019/0055465 A1    Feb. 21, 2019

(30) Foreign Application Priority Data

Aug. 17, 2017 (KR) .................. 10-2017-0104102

(51) Int. Cl.
| | | |
|---|---|---|
| *H01L 51/54* | (2006.01) | |
| *C09K 11/02* | (2006.01) | |
| *C08L 33/10* | (2006.01) | |
| *C09K 11/70* | (2006.01) | |
| *H01L 51/00* | (2006.01) | |

(Continued)

(52) U.S. Cl.
CPC .............. *C09K 11/02* (2013.01); *C08L 33/10* (2013.01); *C09K 11/703* (2013.01); *H01L 51/0043* (2013.01); *B82Y 20/00* (2013.01); *B82Y 40/00* (2013.01); *C08L 2203/20* (2013.01); *C08L 2205/025* (2013.01); *C09K 11/025* (2013.01); *G02F 1/1368* (2013.01); *G02F 1/133514* (2013.01); *G02F 1/133528* (2013.01); *G02F 1/133617* (2013.01); *G02F 1/136286* (2013.01); *G02F 2202/36* (2013.01); *H01L 27/322* (2013.01); *H01L 51/502* (2013.01); *H01L 51/5024* (2013.01); *H01L 51/5268* (2013.01); *H01L 2251/5369* (2013.01)

(58) Field of Classification Search
CPC . C09K 11/025; H01L 51/502; H01L 51/5024; H01L 51/5268
See application file for complete search history.

(56) References Cited

U.S. PATENT DOCUMENTS 6,132,937 A    10/2000   Suzuki
7,592,124 B2    9/2009   Chiba et al.
(Continued)

FOREIGN PATENT DOCUMENTS

JP    3920449 B2    5/2007
JP    4014872 B2    11/2007
(Continued)

*Primary Examiner* — George R Fourson, III
(74) *Attorney, Agent, or Firm* — Cantor Colburn LLP

(57) ABSTRACT

A composition including a plurality of metal oxide particles including a first stabilizer and a second stabilizer on a surface thereof; a plurality of quantum dots; a binder polymer including a carboxylic acid group; a polymerizable monomer including a carbon-carbon double bond; an initiator; optionally a multi-thiol compound comprising at least two thiol groups at one or more terminal ends thereof; and a solvent, wherein the first stabilizer and the second stabilizer are as provided herein.

25 Claims, 4 Drawing Sheets

(51) Int. Cl.
H01L 27/32 (2006.01)
B82Y 20/00 (2011.01)
B82Y 40/00 (2011.01)
G02F 1/1335 (2006.01)
G02F 1/1368 (2006.01)
G02F 1/1362 (2006.01)
H01L 51/52 (2006.01)
H01L 51/50 (2006.01)

(56) References Cited

U.S. PATENT DOCUMENTS

| | | | |
|---|---|---|---|
| 9,120,149 B2 | 9/2015 | Coe-Sullivan et al. | |
| 9,341,946 B2 | 5/2016 | Park et al. | |
| 2017/0059988 A1 | 1/2017 | Choi Gwang Hei et al. | |
| 2017/0115562 A1* | 4/2017 | Kim | G03F 7/0007 |
| 2017/0226414 A1* | 8/2017 | Nick | C09K 11/025 |
| 2017/0247611 A1* | 8/2017 | Nick | C09K 11/02 |
| 2017/0321114 A1* | 11/2017 | Kamo | C09D 201/00 |
| 2018/0122993 A1* | 5/2018 | Camras | H01L 33/005 |
| 2018/0239246 A1* | 8/2018 | Park | G03F 7/0044 |
| 2018/0239247 A1* | 8/2018 | Kwon | G03F 7/0044 |
| 2019/0016952 A1* | 1/2019 | Qiu | C08K 9/02 |
| 2019/0185743 A1* | 6/2019 | Kim | H01L 51/5284 |
| 2019/0198796 A1* | 6/2019 | Kim | H01L 51/5072 |
| 2019/0211265 A1* | 7/2019 | Park | C09K 11/883 |

FOREIGN PATENT DOCUMENTS

| | | |
|---|---|---|
| JP | 2017041571 A | 2/2017 |
| KR | 101427445 B1 | 8/2014 |
| KR | 20160060904 | 5/2016 |
| KR | 101682825 B1 | 12/2016 |
| KR | 20170011208 | 2/2017 |
| KR | 20170019277 | 2/2017 |
| KR | 20170023728 A | 3/2017 |

* cited by examiner

Pattern Preparation by using a photoresist

Repeating the Patterning Process three times

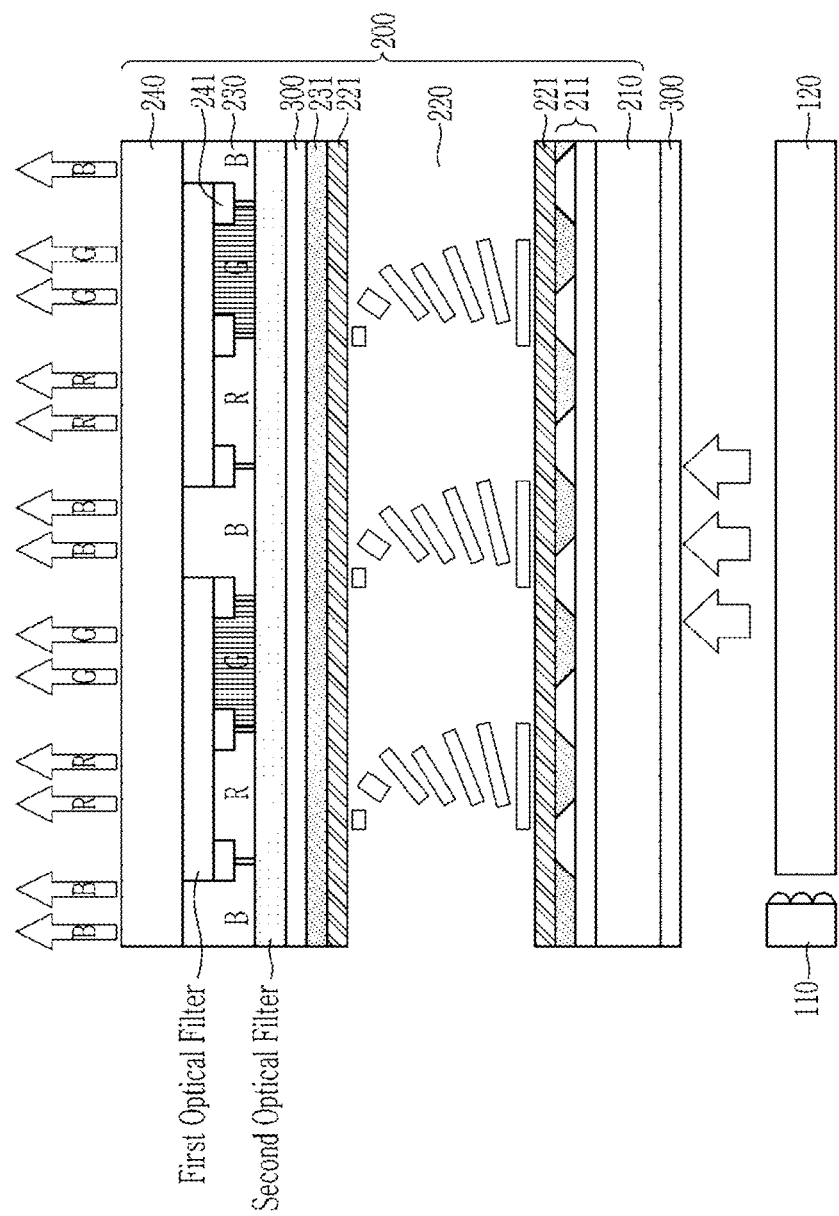

COMPOSITIONS, QUANTUM DOT POLYMER COMPOSITE AND LAYERED STRUCTURE PRODUCED THEREFROM, AND ELECTRONIC DEVICE INCLUDING THE SAME

CROSS-REFERENCE TO RELATED APPLICATION

This application claims priority to and the benefit of Korean Patent Application No. 10-2017-0104102 filed in the Korean Intellectual Property Office on Aug. 17, 2017, and all the benefits accruing therefrom under 35 U.S.C. § 119, the entire contents of which are incorporated herein by reference.

BACKGROUND

1. Field

Compositions, quantum dot-polymer composites, layered structures produced therefrom, and electronic devices including the same are disclosed.

2. Description of the Related Art

Quantum dots may be applicable for various display devices such as a liquid crystal display in the form of a quantum dot-polymer composite. For the application of the quantum dot-polymer composite in various devices, there remains a need for a method of patterning the quantum dot-polymer composite effectively and efficiently.

SUMMARY

An embodiment Is related to a composition capable of providing a quantum dot-polymer composite or a pattern thereof.

Another embodiment is related to a method of producing such a composition.

Another embodiment is related to the quantum dot-polymer composite.

Another embodiment is related to a method of patterning the quantum dot-polymer composite.

Another embodiment is related to a layered structure including a pattern of the quantum dot-polymer composite.

Another embodiment is related to a display device including the quantum dot-polymer composite.

Another embodiment is related to a dispersion including a metal oxide particle including a first stabilizer and a second stabilizer on a surface thereof.

In an embodiment, a composition includes a plurality of metal oxide particles including a first stabilizer and a second stabilizer on a surface thereof; a plurality of quantum dots; a binder polymer including a carboxylic acid group (—COOH); a polymerizable monomer including a carbon-carbon double bond; an initiator; optionally a multi-thiol compound comprising at least two thiol groups (e.g., at its terminal ends); and a solvent, wherein the first stabilizer includes a first polymer including a repeating unit of the formula —RO— (wherein, R is a C1 to C5 alkylene group), —$R_1$COO— (wherein $R_1$ is a C1 to C30 substituted or unsubstituted alkylene group, a C6 to C20 substituted or unsubstituted arylene group, a C6 to C30 substituted or unsubstituted cycloalkylene group, or a combination thereof), —$CR_1R_2$—CAR—(wherein, A is a hydrogen atom, —COOH, —COOR, or —OCOR, wherein R, $R_1$, and $R_2$ are independently a hydrogen atom, a C1 to C10 substituted or unsubstituted alkyl group, or a combination thereof), —OCONH—R—NHCOO—R'— (wherein, R and R' are independently a C1 to C30 substituted or unsubstituted alkylene group, a C6 to C20 substituted or unsubstituted arylene group, a C6 to C30 substituted or unsubstituted cycloalkylene group, or a combination thereof), or a combination thereof, and the second stabilizer includes a second polymer Including a main chain, including a polymer including substituted or unsubstituted alkylene groups having a carboxylic acid group in the main chain (e.g., as a repeating unit), a multiple aromatic ring-containing polymer including a carboxylic acid group (—COOH) and having a backbone structure wherein two aromatic rings are bound to a quaternary carbon atom being a constituent atom of another cyclic moiety in the main chain, or a combination thereof.

In an embodiment, the polymerizable monomer may be photopolymerizable.

In an embodiment, the initiator may be a photoinitiator.

The metal oxide particle may include a titanium oxide, a silicon oxide, a barium oxide, a zinc oxide, or a combination thereof.

The metal oxide particle may include $TiO_2$, $SiO_2$, $BaTiO_3$, $Ba_2TiO_4$, ZnO, $ZrO_2$, or a combination thereof.

An average particle size of the metal oxide particle may be greater than or equal to about 30 nanometers.

An average particle size of the metal oxide particle may be less than or equal to about 1000 nanometers.

An average particle size of the metal oxide particle may be about 100 nanometers to about 500 nanometers.

A weight average molecular weight of the first stabilizer may be greater than or equal to about 100 grams per mole.

A weight average molecular weight of the first stabilizer may be less than or equal to about 7000 grams per mole.

The first stabilizer may include a poly(C1 to C5 alkylene oxide), a polyester, a polyurethane, a poly(C1 to C10 alkyl (meth)acrylate), or a combination thereof.

The first stabilizer may not include a carboxylic acid group (—COOH).

The second stabilizer may be a copolymer including a first repeating unit including the alkylene substituted with the carboxylic acid group and a second repeating unit including alkylene substituted with a (C1 to C15 alkyl) ester group, a (C7 to C13 arylalkyl) ester group, a (C6 to C12 aryl) ester group, or a combination thereof.

The second stabilizer may be a polymerization product of a monomer combination including a first monomer that is (meth)acrylic acid fumaric acid, maleic acid, crotonic acid, ethyl acrylic acid, or a combination thereof; and a second monomer that is a (C1 to C15 alkyl) (meth)acrylate, a (C7 to C13 arylalkyl) (meth)acrylate, or (C6 to C12 aryl) (meth)acrylate.

The second polymer included in the second stabilizer may have an acid value of greater than or equal to about 90 milligrams of KOH per gram and a weight average molecular weight of greater than or equal to about 3600 grams per mole.

The second polymer included in the second stabilizer may have an acid value of about 100 milligrams of KOH per gram to about 200 milligrams of KOH per gram and a weight average molecular weight of about 5000 grams per mole to about 20000 grams per mole.

The first stabilizer and the second stabilizer may be bound to the surface of the metal oxide particle.

The quantum dot may include a Group II-VI compound, a Group III-V compound, a Group IV-VI compound, a Group IV element or compound, a Group II—III-VI compound, a Group I—II-IV-VI compound, or a combination thereof.

The binder polymer may include
a copolymer of a monomer combination including a first monomer including a carboxylic acid group and a carbon-carbon double bond, a second monomer having a carbon-carbon double bond and a hydrophobic group and not having a carboxylic acid group, and optionally a third monomer having a carbon-carbon double bond and a hydrophilic group and not having a carboxylic acid group;
a multiple aromatic ring-containing polymer comprising a carboxylic acid group (—COOH) and having a backbone structure wherein two aromatic rings are bound to a quaternary carbon atom being a constituent atom of another cyclic moiety in a main chain; or
a combination thereof.

The binder polymer may have an acid value of greater than or equal to about 50 milligrams of KOH per gram.

The binder polymer may have an acid value of less than or equal to about 240 milligrams KOH per gram.

The composition may further include a multi-thiol compound including at least two thiol groups at its terminal ends.

In the composition, an amount of the plurality of metal oxide particles may be greater than an amount of the first stabilizer.

An amount of the plurality of quantum dot is greater than or equal to about 20 weight percent and an amount of the plurality of metal oxide particles is greater than or equal to about 5 weight percent, each based on a total weight of solid contents of the composition.

In the composition, based on a total weight of solid contents of the composition,
an amount of the plurality of metal oxide particles may be about 0.1 weight percent to about 50 weight percent,
an amount of the plurality of quantum dots may be about 1 weight percent to about 70 weight percent,
an amount of the binder polymer may be about 0.5 weight percent to about 60 weight percent;
an amount of the polymerizable monomer may be about 1 weight percent to about 70 weight percent; and
an amount of the initiator may be about 0.01 weight percent to about 10 weight percent.

In another embodiment, a quantum dot-polymer composite prepared by polymerization of the composition may be redissolved when it is dipped in an alkali aqueous solution of pH 11 or greater.

In another embodiment, in the quantum dot-polymer composite prepared by polymerization of the composition, a solution obtained by dipping the quantum dot-polymer composite in an alkali aqueous solution does not block a pore of a filter having a pore size of greater than or equal to about 400 micrometers when filtering the solution through the filter.

In another embodiment, a method of forming patterns of a quantum dot-polymer composite includes,
coating the composition on a transparent substrate to form a film;
exposing a predetermined region of the film to obtain a quantum dot-polymer composite film; and
developing the quantum dot-polymer composite film with an alkali aqueous solution.

The method of forming patterns may further include heat-treating the obtained pattern.

In another embodiment, a layered structure includes
a substrate; and
an emissive layer disposed on the substrate,
wherein the emissive layer includes a pattern of a quantum dot-polymer composite,
the pattern of the quantum dot-polymer composite includes at least one repeating section that emits a first light,
the quantum dot-polymer composite includes a polymer matrix, wherein a plurality of quantum dots and a plurality of metal oxide particles are dispersed in the polymer matrix,
the metal oxide particles include a first stabilizer and a second stabilizer on a surface thereof,
the first stabilizer includes a first polymer including a repeating unit of the formula —RO— (wherein, R is a C1 to C5 alkylene group), —$R_1$COO— (wherein $R_1$ is a C1 to C30 substituted or unsubstituted alkylene group, a C6 to C20 substituted or unsubstituted arylene group, a C6 to C30 substituted or unsubstituted cycloalkylene group, or a combination thereof), —$CR_1R_2$—CAR—(wherein, A is a hydrogen atom, —COOH, —COOR, or —OCOR, wherein R, $R_1$, and $R_2$ are independently a hydrogen atom, a C1 to C10 substituted or unsubstituted alkyl group, or a combination thereof), —OCONH—R—NHCOO—R'— (wherein, R and R' are Independently a C1 to C30 substituted or unsubstituted alkylene group, a C6 to C20 substituted or unsubstituted arylene group, a C6 to C30 substituted or unsubstituted cycloalkylene group, or a combination thereof), or a combination thereof, and
the second stabilizer includes a second polymer including a main chain, including a polymer including substituted or unsubstituted alkylene groups having a carboxylic acid group in the main chain, a multi-aromatic ring-containing polymer including a carboxylic acid group (—COOH) and having a backbone structure wherein two aromatic rings are bound to a quaternary carbon atom being a constituent atom of another cyclic moiety in the main chain, or a combination thereof.

The repeating units of the first stabilizer may be linked to each other to form a main chain or backbone of the first polymer.

At least a portion of the substrate may be configured to cut (e.g., absorb or reflect) blue light.

The polymer matrix may include a cross-linked polymer and a binder polymer including a carboxylic acid group.

The cross-linked polymer may include a thiolene polymer, a cross-linked poly(meth)acrylate, or a combination thereof.

The metal oxide particle may include a titanium oxide, a silicon oxide, a barium oxide, a zinc oxide, or a combination thereof.

An average particle size of the metal oxide particle may be greater than or equal to about 100 nanometers and less than or equal to about 500 nanometers.

The first stabilizer may include poly(C1 to C5 alkylene oxide), a polyester, a polyurethane, a poly(C1 to C10 alkyl (meth)acrylate), or a combination thereof.

The first stabilizer may have a weight average molecular weight of about 100 grams per mole to about 7000 grams per mole.

The second polymer included in the second stabilizer may have an acid value of greater than or equal to about 100 milligrams KOH per gram and a weight average molecular weight of greater than or equal to about 5000 grams per mole.

In another embodiment, a display device includes a light source; and a light emitting element including the layered structure,
wherein the light source is configured to provide incident light to the light emitting element. The incident light may be at a wavelength within a range of about 440 nanometers to about 470 nanometers.

The composition may provide a quantum dot-polymer composite or a pattern thereof having satisfactory or improved photoluminescence properties and an improved re-solubility in the patterning process using an alkali aqueous solution as a developing solution. The composition may be used in a process enabling a mass production of a quantum dot-polymer composite pattern.

BRIEF DESCRIPTION OF THE DRAWINGS

These and/or other aspects will become apparent and more readily appreciated from the following description of the embodiments, taken in conjunction with the accompanying drawings in which:

FIG. 3 is a schematic illustration showing a cross-section of a display device according to another non-limiting embodiment.

DETAILED DESCRIPTION

Figure 1:
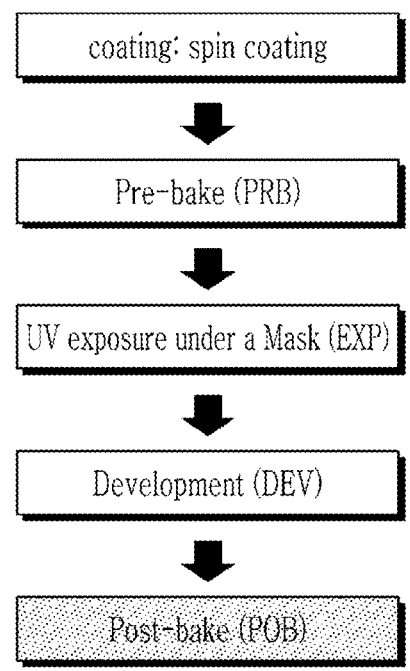
FIG. 1 is a view showing a process of producing a pattern for a color filter using a composition (photoresist) according to an embodiment.
Figure 1:
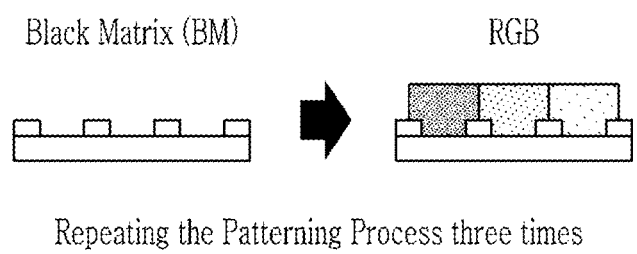

Advantages and characteristics of this disclosure, and a method for achieving the same, will become evident referring to the following example embodiments together with the drawings attached hereto. However, the embodiments should not be construed as being limited to the embodiments set forth herein. Accordingly, the exemplary embodiments are merely described below, by referring to the figures, to explain aspects of the present Inventive concept. Expressions such as "at least one of," when preceding a list of elements, modify the entire list of elements and do not modify the individual elements of the list. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", and the word "include" and variations such as "includes" or "including", when used in this specification, specify the presence of stated features, regions, integers, steps, operations, elements, and/or components, but do not preclude the presence or addition of one or more other features, regions, integers, steps, operations, elements, components, and/or groups thereof. Therefore, the above words will be understood to imply the inclusion of stated elements but not the exclusion of any other elements.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as Illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" may refer to a compound, a group, or a moiety wherein at least one hydrogen atom thereof is substituted with a substituent that is a C1 to C30 alkyl group, a C2 to C30 alkenyl group, a C2 to C30 alkynyl group, a C2 to C30 epoxy group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently a hydrogen atom or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or an inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C6 to C30 cycloalkynyl group, or a C2 to C30 heterocycloalkyl group.

As used herein, when a definition is not otherwise provided, the term "hetero" refers to inclusion of at least one (e.g., 1 to 3) hetero atom that is N, O, S, Si, and P.

As used herein, when a definition is not otherwise provided, the term "alkyl group" refers to a group derived from a straight or branched chain saturated aliphatic hydrocarbon having the specified number of carbon atoms and having a valence of at least one.

As used herein, when a definition is not otherwise provided, the term "alkoxy group" refers to "alkyl-O—", wherein the term "alkyl" has the same meaning as described As used herein, when a definition is not otherwise provided, the term "alkenyl group" refers to a straight or branched chain, monovalent hydrocarbon group having at least one carbon-carbon double bond.

As used herein, when a definition is not otherwise provided, the term "alkynyl group" refers to a straight or branched chain, monovalent hydrocarbon group having at least one carbon-carbon triple bond.

As used herein, when a definition is not otherwise provided, the term "cycloalkyl group" refers to a monovalent group having one or more saturated rings in which all ring members are carbon.

As used herein, when specific definition is not otherwise provided, the term "cycloalkenyl group" refers to a monovalent group having one or more rings and one or more carbon-carbon double bond in the ring, wherein all ring members are carbon.

As used herein, when specific definition is not otherwise provided, the term "cycloalkynyl group" refers to a monovalent group having one or more rings and one or more carbon-carbon triple bond in the ring, wherein all ring members are carbon.

As used herein, when specific definition is not otherwise provided, the term "acyl group" refers to "alkyl-C(=O)—", wherein the term "alkyl" has the same meaning as described above.

As used herein, when a definition is not otherwise provided, the term "heterocycloalkyl group" refers to a cycloalkyl group as defined above, wherein at least one (e.g. 1 to 3) carbon atoms are replaced with heteroatoms selected from N, O, S, Si, and P.

As used herein, when a definition is not otherwise provided, the term "aryl", which is used alone or in combination, refers to an aromatic hydrocarbon group containing at least one ring and having the specified number of carbon atoms. The term "aryl" may be construed as including a group with an aromatic ring fused to at least one cycloalkyl ring.

As used herein, when a definition is not otherwise provided, the term "heteroaryl group" refers to an aryl group including carbon and at least one (e.g. 1 to 3) heteroatoms selected from the group consisting of N, O, S, Si, and P as ring atoms.

As used herein, when a definition is not otherwise provided, the term "arylalkyl group" refers to a substituted or unsubstituted aryl group covalently linked to an alkyl group that is linked to a compound.

As used herein, when a definition is not otherwise provided, the term "heteroarylalkyl group" refers to a substituted or unsubstituted heteroaryl group covalently linked to an alkyl group that is linked to a compound.

As used herein, the term "alkylene group" may refer to a straight or branched saturated aliphatic hydrocarbon group having a valence of at least two, optionally substituted with one or more substituents.

As used herein, the term "arylene group" may refer to a functional group having a valence of at least two obtained by removal of at least two hydrogen atoms in at least one aromatic ring, optionally substituted with one or more substituents.

As used herein, when a definition is not otherwise provided, the term "heteroarylene group" refers to a functional group having a valence of at least two obtained by removal of at least two hydrogens in an aromatic ring, containing at least one (e.g., one to three) heteroatoms selected from the group consisting of N, O, S, Si, and P as ring-forming elements, optionally substituted with one or more substituents where indicated, provided that the valence of the heteroarylene group is not exceeded.

As used herein, the term "aliphatic organic group" may refer to a C1 to C30 straight or branched hydrocarbon group (e.g., C1 to C30 alkyl, C2 to C30 alkenyl, C2 to C30 alkynyl), the term "aromatic organic group" may refer to C6 to C30 aryl group or C2 to C30 heteroaryl group, and the term "alicyclic organic group" may refer to a C3 to C30 cycloalkyl group, a C3 to C30 cycloalkenyl group, and a C3 to C30 cycloalkynyl group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C30 alkyl" refers to a C1 to C30 alkyl group substituted with a C6 to C30 aryl group, the total number of carbon atoms in the resulting aryl substituted alkyl group is C7 to C60.

As used herein, the term "(meth)acrylate" refers to acrylate and/or methacrylate.

As used herein, the term "hydrophobic moiety" may refer to a moiety that causes a given compound Including the same to exhibit agglomeration in an aqueous solution and to have a tendency to repel water For example, the hydrophobic moiety may include an aliphatic hydrocarbon group having a carbon number of greater than or equal to 2 (alkyl, alkenyl, alkynyl, etc.), an aromatic hydrocarbon group having a carbon number of greater than or equal to 6 (phenyl, naphthyl, aralkyl group, etc.), or an alicyclic hydrocarbon group having a carbon number of greater than or equal to 5 (cyclohexyl, norbomene, norbomane, tricyclodecane, etc.).

As used herein, the term "visible light" refers to light having a wavelength of about 390 nanometers (nm) to about 700 nm. As used herein, the term "UV" refers to ultraviolet light having a wavelength of greater than or equal to about 200 nm and less than about 390 nm.

As used herein, a photoconversion efficiency (PCE) refers to a ratio of emission light relative to incident light (e.g., blue light). For example, a blue PCE is a ratio of a light emission dose of a quantum dot-polymer composite relative to absorbed light dose of the quantum dot-polymer composite from excited light (i.e., blue light). The total light dose (B) of excited light may be obtained by integrating its photoluminescence (PL) spectrum, the PL spectrum of the quantum dot-polymer composite film is measured, a dose (A) of light in a green or red wavelength region emitted from the quantum dot-polymer composite film and a dose (B') of blue light may be obtained, and a PCE is obtained by the following equation:

$$A/(B-B') \times 100\% = \text{photoconversion efficiency (\%)}$$

As used herein, the term "dispersion" refers to dispersion wherein a dispersed phase is a solid and a continuous phase includes a liquid. For example, the term "dispersion" may refer to a colloidal dispersion wherein the dispersed phase has a dimension of greater than or equal to about 1 nanometer (nm), for example, greater than or equal to about 2 nm, greater than or equal to about 3 nm, or greater than or equal to about 4 nm and several micrometers (μm) or less, (e.g., less than or equal to about 2 μm, or less than or equal to about 1 μm).

As used herein, the term "Group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto.

As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

A liquid crystal display (hereinafter, LCD) is a display in which polarized light passed through liquid crystal expresses a color while passing through an absorptive color filter. LCD may have drawbacks of a narrow viewing angle and a low luminance due to low light transmittance of the absorptive color filter. Replacing the absorptive color filter with a photoluminescent-type color filter may make it possible for the display to have a wider viewing angle and an improved luminance.

When a quantum dot is colloid-synthesized, the particle size may be relatively freely controlled and also uniformly controlled. When a quantum dot has a size of less than or equal to about 10 nm, the quantum confinement effects in which the bandgap is more increased according to decreasing a size become significant, thus the energy density is enhanced. The quantum dot may have a theoretical quantum yield (QY) of about 100%, and may emit light having high color purity (e.g., a full width at half maximum (FWHM) of less than or equal to about 40 nm), and thus it may achieve the enhanced photoluminescence efficiency and the improved color reproducibility.

For the application in a display device, quantum dots (e.g., including a polymer and/or an inorganic material) may be dispersed in a host matrix polymer to provide a quantum dot-polymer composite. A color filter including the quantum dot-polymer composite is expected to provide a display with a high luminance, a wide viewing angle, and a high color reproducibility.

However, unlike an absorptive color filter, patterning of the quantum dot-polymer composite has various technical limits. For example, in order to achieve the aforementioned effects, the composite may include an increased amount (e.g., greater than or equal to about 15%, greater than or equal to about 16%, greater than or equal to about 17%, greater than or equal to about 18%, greater than or equal to about 19%, or greater than or equal to about 20% by weight based on a total weight of solid contents) of quantum dots in a sufficiently dispersed state. However, quantum dots may have a limited or unfavorable dispersibility for a polymer matrix.

In addition, for the uniform and improved photoluminescence, the composite may include a light scatterer in a considerable amount (e.g., greater than or equal to about 5%, greater than or equal to about 6%, greater than or equal to about 7%, greater than or equal to about 8%, greater than or equal to about 9%, or even greater than or equal to about 10% by weight based on a total weight of solid contents). The light scatterer may uniformly spread light emitted from the quantum dot and prolong an absorption path length of excitation light from a host material without reacting the host material. However, as in the quantum dot, the light scatterer may also exhibit a limited or unfavorable dispersibility in the host matrix polymer.

Increasing the amounts of the dispersed light scatterer or the quantum dots may greatly reduce a dissolubility of the composite, for example, in a developing solution during a developing process to obtain a desired patter. The reduced dissolubility may make the quantum dot-polymer composite difficult, for example impossible, to form a desirable pattern, and may cause serious defects (e.g., filter clogging of a solution after the development) during a mass-production of a pattern.

Due to the technical limits, it is difficult to prepare a composition capable of realizing mass-production of a quantum dot-polymer composite pattern.

Meanwhile, at least a portion of a substrate where the quantum dot-polymer composite pattern is to be disposed may be configured to cut (e.g., absorb or reflect) excitation light (e.g., blue light at less than or equal to about 490 nm, less than or equal to about 480 nm, or less than or equal to about 470 nm). For example, at least a portion of the substrate may include a blue light cut (absorbing or reflecting) layer. Using the substrate may cause an additional difficulty in the process of developing the formed quantum dot-polymer composite film.

A composition according to an embodiment includes (e.g., a plurality of) metal oxide (e.g., fine) particles including a first stabilizer and a second stabilizer on a surface thereof; (e.g., a plurality of) quantum dots; a binder polymer including a carboxylic acid group (—COOH); a polymerizable (e.g., photopolymerizable) monomer including a carbon-carbon double bond; an initiator (e.g., a photoinitiator); and a solvent. The composition of an embodiment may improve a resolubility of the quantum dot composite film (e.g., disposed on a substrate or a substrate where a blue cut layer (blue light absorption layer) is disposed on at least a portion of its surface) to an alkali aqueous solution to accomplish a mass production of a pattern.

The metal oxide particle may act as a light scatterer in the composite. The metal oxide particle may have a relatively high (e.g., higher than a polymer matrix which will be described later) refractive index. In an embodiment, the metal oxide particle may be non-light emitting.

The metal oxide particle may include a titanium oxide, a silicon oxide, a barium oxide, a zinc oxide, or a combination thereof. For example, the metal oxide particle may Include $TiO_2$, $SiO_2$, $BaTIO_3$, $Ba_2TiO_4$, $ZnO$, $ZrO_2$, or a combination thereof.

An average particle size (e.g., a diameter or the largest linear length crossing the particle) of the metal oxide (e.g., fine) particle may be greater than or equal to about 30 nm, for example, greater than or equal to about 100 nm, greater than or equal to about 150 nm, greater than or equal to about 160 nm, greater than or equal to about 170 nm, greater than or equal to about 180 nm, or greater than or equal to about 190 nm. An average particle size of the metal oxide particle may be less than or equal to about 1,000 nm, less than or equal to about 900 nm, less than or equal to about 800 nm, less than or equal to about 700 nm, less than or equal to about 600 nm, or less than or equal to about 500 nm. An average particle size of the metal oxide particle may be about 100 nm to about 500 nm or about 190 nm to about 450 nm. A size of the metal oxide particle may be selected considering amounts of other components in the composition, a film thickness of a composite, and the like.

The metal oxide particles may or may not be the same light scatterer used for prolonging the absorption wavelength length. In an embodiment, a size and a size distribution of the metal oxide particles may be selected based on a refractive index inconsistency of between the particle and the host matrix material for the composite and a predetermined wavelength(es) to be scattered according to a scattering theory (e.g., Rayleigh scattering or Mie scattering theory).

The metal oxide particle may be included in the composition in an amount of greater than or equal to about 0.1 weight percent (wt %), greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, or greater than or equal to about 9 wt % (based on a solid content) in the composition. The metal oxide particle may be may be included in an amount of about 50 wt %, less than or equal to about 40 wt %, less than or equal to about 30 wt %, less than or equal to about 25 wt %, less than or equal to about 20 wt %, less than or equal to about 19 wt %, less than or equal to about 18 wt %, less than or equal to about 17 wt %, less than or equal to about 16 wt %, or less than or equal to about 15 wt % (based on a solid content) in the composition. The aforementioned range for the amount of the metal oxide particles may be selected for a desirable photoluminescence characteristic (e.g., in order to achieve a desirable refractive index of the composition (or the composite) and in order to increase a probability for light entered into the composition (or the composite) to meet with quantum dot) of a composite which will be described later.

The metal oxide particles may tend to be precipitated in the composition (for example, including quantum dots or a dispersion thereof). Precipitation of the metal oxide particles (or a change in a dispersion state thereof) in the composition for the quantum dot-polymer composite may cause serious defects in the final product.

For example, the precipitation of the metal oxide particles may change a solid content in the dispersed composition, causing deterioration of uniformity of the final product. The metal oxide particles included in the aforementioned amount may decrease the dissolubility of the composite during the developing process of a quantum dot-polymer composite pattern, and the obtained quantum dot-polymer composite may have greatly decreased re-solubility with respect to a developer solution. For example, the quantum dot-polymer composite may have unsatisfactory dissolubility to an alkali aqueous solution (e.g., greater than or equal to about pH 8, greater than or equal to about 8.5, greater than or equal to about 9, greater than or equal to about 9.5, greater than or equal to about 10, greater than or equal to about 10.5, greater than or equal to about 11 and less than or equal to about pH 13, less than or equal to about 13.5, or less than or equal to about 12), so that the developing process of the quantum dot-polymer composite using the same may produce composite flakes having a size of several hundred micrometers (e.g., greater than or equal to about 100 μm, greater than or equal to about 200 μm, greater than or equal to about 300 μm, greater than or equal to about 400 μm, greater than or equal to about 500 μm, or even greater than or equal to about 0.1 millimeters). The flakes may block a line of filtering a liquid after the developing process, thereby making it difficult to realize a mass-production of a pattern.

In the composition of an embodiment, the metal oxide particles include a first stabilizer of a predetermined polymer type (i.e., a first polymer) and a second stabilizer of a predetermined polymer type (i.e., a second polymer) on a surface thereof. The metal oxide particle may or may not have a compound including a polymerizable functional group such as (meth)acrylate on a surface thereof. The particles having a surface treated with the first and second stabilizers may exhibit an improved dispersibility in the composition, and the composite obtained from the composition may exhibit a re-solubility in a required level for the development. The composition including the metal oxide particles may exhibit an improved storage-stability by maintaining good dispersibility even after passing a prolonged time. The first and second stabilizers may not have unfavorable influences on luminous efficiency of the obtained composite.

The first stabilizer includes a first polymer including —RO— (wherein, R is a C1 to C5 or C2 to C4 alkylene group such as ethylene or propylene), —$R_1$COO— (wherein $R_1$ is a C1 to C30 or C2 to C20 substituted or unsubstituted alkylene group, a C6 to C20 substituted or unsubstituted arylene group, a C3 to C30 substituted or unsubstituted cycloalkylene group, or a combination thereof), —$CR_1R_2$— CAR—(wherein, A is a hydrogen atom, —COOH, —OCOR, or —COOR, wherein R, $R_1$, and $R_2$ are independently a hydrogen atom, a C1 to C10 substituted or unsubstituted alkyl group, or a combination thereof), —OCONH—R—NHCOO—R'— (wherein, R and R' are independently, a C1 to C30 or C2 to C20 substituted or unsubstituted alkylene group, a C6 to C20 substituted or unsubstituted arylene group, a C3 to C30 substituted or unsubstituted cycloalkylene group, or a combination thereof), or a combination thereof, as a repeating unit. The first stabilizer may or may not include a carboxylic acid group. The first stabilizer may have a different structure and/or a molecular weight and/or an acid value from a polymer of the second stabilizer that will be described later.

In an embodiment, the first stabilizer may include a poly(C1 to C5 alkylene glycol) such as polyethylene glycol or polypropylene glycol, a poly((meth)acrylate) such as a poly(C1 to C30 (or to C10) alkyl)(meth)acrylate), polyglycolic acid, polylactic acid, polycaprolactone, polyhydroxyalkanoate, polyhydroxybutyrate, a poly(C2 to C30 (or to C10) alkylene adipate), a poly(C2 to C30 (or to C10) alkylene succinate), a poly(C2 to C30 (or to C10) alkylene terephthalate), a poly(C2 to C30 (or to C10) alkylene naphthoate), a polyester, a polyurethane (such as a urethane polymer/oligomer or a modified urethane polymer/oligomer), a copolymer thereof, or a combination thereof. For example, the first stabilizer may include a polyester including an aliphatic group, a poly(butyl acrylate), or a combination thereof.

The first stabilizer may have a weight average molecular weight of greater than or equal to about 100 grams per mole (g/mol), for example, greater than or equal to about 200 g/mol, greater than or equal to about 250 g/mol, greater than or equal to about 300 g/mol, greater than or equal to about 400 g/mol, or greater than or equal to about 500 g/mol. The stabilizer may have a weight average molecular weight of less than or equal to about 7000 g/mol, for example, less than or equal to about 6900 g/mol, less than or equal to about 6800 g/mol, less than or equal to about 6700 g/mol, less than or equal to about 6600 g/mol, less than or equal to about 6500 g/mol, less than or equal to about 6400 g/mol, less than or equal to about 6300 g/mol, less than or equal to about 6200 g/mol, less than or equal to about 6100 g/mol, less than or equal to about 6000 g/mol, less than or equal to about 5900 g/mol, less than or equal to about 5800 g/mol, less than or equal to about 5700 g/mol, less than or equal to about 5600 g/mol, less than or equal to about 5500 g/mol, less than or equal to about 5400 g/mol, less than or equal to about 5300 g/mol, less than or equal to about 5200 g/mol, less than or equal to about 5100 g/mol, or less than or equal to about 5000 g/mol.

The second stabilizer includes a polymer including a substituted or unsubstituted alkylene main chain having a carboxylic acid group. The second stabilizer may be a copolymer including a first repeating unit including an alkylene substituted with a carboxylic acid group and a second repeating unit including alkylene substituted with an ester group, In particular a (C1 to C15 alkyl) ester group, a (C7 to C13 arylalkyl) ester group, or a (C6 to C12) aryl ester group. The second stabilizer may include a polymerization product of a monomer combination including a first monomer that will be described later, for example, a first monomer that is (meth)acrylic acid, fumaric acid, maleic acid, crotonic acid, ethyl acrylic acid or a combination thereof, and a second monomer that will be described later, for example, a (C1 to C15 alkyl) (meth)acrylate, a (C7 to C13 arylalkyl) (meth)acrylate, or a (C6 to C12 aryl) (meth)acrylate. The second stabilizer may include a copolymer of a monomer combination including a first monomer including a carboxylic acid group and a carbon-carbon double bond and a second monomer having a carbon-carbon double bond and a hydrophobic group and not having a carboxylic acid group.

The first monomer and the second monomer is the same as described in the binder polymer including a carboxylic acid group (—COOH).

In an embodiment, an acid value of the polymer included in the second stabilizer may be greater than about 90 milligrams (mg) of KOH per gram (g), for example, greater than or equal to about 95 mg KOH/g, greater than or equal to about 100 mg KOH/g, greater than or equal to about 101 mg KOH/g, greater than or equal to about 102 mg KOH/g, greater than or equal to about 103 mg KOH/g, greater than or equal to about 104 mg KOH/g, greater than or equal to about 105 mg KOH/g, greater than or equal to about 106 mg KOH/g, greater than or equal to about 107 mg KOH/g, greater than or equal to about 108 mg KOH/g, greater than or equal to about 109 mg KOH/g, or greater than or equal to about 110 mg KOH/g. An acid value of the polymer included in the second stabilizer may be less than or equal to about 200 mg KOH/g, for example, less than or equal to about 190 mg KOH/g, less than or equal to about 180 mg KOH/g, less than or equal to about 170 mg KOH/g, less than or equal to about 160 mg KOH/g, or less than or equal to about 150 mg KOH/g.

In an embodiment, the polymer included in the second stabilizer may have an acid value of about 100 mg KOH/g to about 160 mg KOH/g. In an embodiment, the polymer included in the second stabilizer may have an acid value of about 110 mg KOH/g to about 150 mg KOH/g. A weight average molecular weight of the polymer included in the second stabilizer may be greater than about 3600 g/mol, for example, greater than or equal to about 4000 g/mol, greater than or equal to about 4500 g/mol, greater than or equal to about 5000 g/mol, greater than or equal to about 5100 g/mol, greater than or equal to about 5200 g/mol, greater than or equal to about 5300 g/mol, greater than or equal to about 5400 g/mol, greater than or equal to about 5500 g/mol, greater than or equal to about 5600 g/mol, greater than or equal to about 5700 g/mol, greater than or equal to about 5800 g/mol, greater than or equal to about 5900 g/mol, or greater than or equal to about 6000 g/mol. A weight average molecular weight of the polymer included in the second stabilizer may be less than or equal to about 20000 g/mol, less than or equal to about 19000 g/mol, less than or equal to about 18000 g/mol, less than or equal to about 17000 g/mol, less than or equal to about 16000 g/mol, less than or equal to about 15000 g/mol, less than or equal to about 14000 g/mol, less than or equal to about 13000 g/mol, less than or equal to about 12000 g/mol, less than or equal to about 11000 g/mol, less than or equal to about 10000 g/mol, less than or equal to about 9000 g/mol, less than or equal to about 8000 g/mol, or less than or equal to about 7000 g/mol.

The metal oxide particles having the first stabilizer and the second stabilizer on a surface thereof (hereinafter, also referred to surface-treated metal oxide particles) may be dispersed in a solvent for the composition which will be described later to form a particle dispersion, for example a uniform particle dispersion. Production of the particle dispersion or the surface-treated metal oxide particles may include: mechanically-treating (e.g., stirring such as ultrasonic wave stirring, milling such as ball milling, and the like) metal oxide particles in an organic solvent including the first stabilizer and/or the second stabilizer. The duration of the treatment is particularly limited, but may be appropriately selected.

In the particle dispersion, an amount of the first stabilizer is not particularly limited and may be selected appropriately. For example, in the particle dispersion, an amount of the first stabilizer may be greater than or equal to about 0.1 wt %, greater than or equal to about 0.5 wt %, or greater than or equal to about 1 wt %, based on a total weight of solid contents (i.e., particulate and stabilizer) in the dispersion. In the particle dispersion, an amount of the first stabilizer may be less than or equal to about 15 wt %, less than or equal to about 14 wt %, less than or equal to about 13 wt %, less than or equal to about 12 wt %, less than or equal to about 11 wt %, less than or equal to about 10 wt %, less than or equal to about 9 wt %, less than or equal to about 8 wt %, less than or equal to about 7 wt %, less than or equal to about 6 wt %, less than or equal to about 5 wt %, less than or equal to about 4 wt %, less than or equal to about 3 wt %, or less than or equal to about 2 wt %.

In the particle dispersion, an amount of the second stabilizer is not particularly limited and may be selected appropriately. For example, in the particle dispersion, an amount of the second stabilizer may be greater than or equal to about 0.1 wt %, greater than or equal to about 0.5 wt %, greater than or equal to about 1 wt % based on a total weight of solid contents (i.e., particulate and stabilizer) in the dispersion. In the particle dispersion, an amount of the second stabilizer may be less than or equal to about 15 wt %, less than or equal to about 14 wt %, less than or equal to about 13 wt %, less than or equal to about 12 wt %, less than or equal to about 11 wt %, less than or equal to about 10 wt %, less than or equal to about 9 wt %, less than or equal to about 8 wt %, less than or equal to about 7 wt %, less than or equal to about 6 wt %, less than or equal to about 5 wt %, less than or equal to about 4 wt %, less than or equal to about 3 wt %, or less than or equal to about 2 wt %.

By the aforementioned treatment, the first stabilizer and the second stabilizer may be present on (e.g., bound to) the surface of the metal oxide particle.

According to an embodiment, the first and the second stabilizers may be bound to the surface of the metal oxide particle (preferably by a chemical bond, a physical interaction, a hydrogen bonding, or a combination thereof) thus they may be not be easily separated from the metal oxide particle in the dispersion solvent.

In the composition, the quantum dot (hereinafter, referred to a semiconductor nanocrystal) may include a Group II-VI compound, a Group III-V compound, a Group IV-VI compound, a Group IV element or compound, a Group I-III-VI compound, a Group II-III-VI compound, a Group I-II-IV-VI compound, or a combination thereof.

The Group II-VI compound may be one or more of a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group II-VI compound may further include a Group III metal. The Group III-V compound may be one or more of a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a combination thereof. The Group III-V compound may further include a Group II metal (e.g., InZnP). The Group IV-VI compound may be one or more of a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; and a quaternary element compound such as SnPbSSe, SnPbSeTe, SnPbSTe, or a combination thereof. Examples of the Group I-III-VI compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto. The Group IV element or compound may be a single element such as Si, Ge, or a combination thereof; and a binary element compound such as SiC, SiGe, or a combination thereof.

The binary element compound, the ternary element compound or the quaternary element compound respectively exist in a uniform concentration in the semiconductor nanocrystal particle or partially different concentrations in the same particle. In addition, the semiconductor nanocrystal may have a core-shell structure wherein a semiconductor nanocrystal surrounds another (different) semiconductor nanocrystal. The core and shell may have an interface, and an element of at least one of the core or the shell in the interface may have a concentration gradient wherein the concentration of the element(s) of the shell decreases toward the core. In addition, the semiconductor nanocrystal may have one core of a semiconductor nanocrystal and multi-shells surrounding the core. In an embodiment, the shell may be multi-layered shell having two or more layers, for example, 2, 3, 4, 5, or more layers. Each layer of the shell may have the same composition or different composition from each other. The adjacent layers may have the different composition from each other. The material of each layer may have a single composition or a combination (e.g., an alloy) of two or more materials. At least one element among materials of each layer may have a concentration changing along with a radial direction. For example, at least one layer may have a concentration gradient of two or more combined materials. For example, at least one layer may include a gradient alloy. The layer including two or more combined materials such as an alloy may have a homogeneous composition (e.g., uniform alloy). The layer having a concentration gradient (e.g., including a gradient alloy) of two or more combined materials may have a heterogeneous alloy composition and the composition is changed along with a radial direction.

In the quantum dot, the shell material and the core material may have different energy bandgap from each other. For example, the energy bandgap of the shell material may be greater than that of the core material. According to another embodiment, the energy bandgap of the shell material may less than that of the core material. When the quantum dot may have a multi-layered shell, the energy bandgap of the outer layer may be greater than the energy bandgap of the layer nearer to the core. The energy bandgap of the layer outer from the multi-layered shell may be less than the energy bandgap of the layer nearer to the core. The quantum dot may control an absorption/photoluminescence wavelength by adjusting a composition and a size. A maximum photoluminescence peak wavelength of the quantum dot may be greater than or equal to about 460 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, greater than or equal to about 610 nm, greater than or equal to about 620 nm, greater than or equal to about 630 nm, greater than or equal to about 640 nm, greater than or equal to about 650 nm, or greater than or equal to about 700 nm. A maximum photoluminescence peak wavelength of the quantum dot may be less than or equal to about 750 nm, less than or equal to about 730 nm, less than or equal to about 720 nm, less than or equal to about 710 nm, less than or equal to about 700 nm, less than or equal to about 690 nm, less than or equal to about 680 nm, less than or equal to about 670 nm, less than or equal to about 660 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm, less than or equal to about 530 nm, less than or equal to about 520 nm, less than or equal to about 510 nm, or less than or equal to about 500 nm.

The quantum dot may have quantum efficiency (QE) of greater than or equal to about 10%, for example, about 30%, greater than or equal to about 50%, greater than or equal to about 60%, greater than or equal to about 70%, greater than or equal to about 90%, or even greater than or equal to about 100%. The semiconductor nanocrystal may have a relatively narrow spectrum so as improve color purity or color reproducibility. The quantum dot may have for example a full width at half maximum (FWHM) of a photoluminescence wavelength spectrum of less than or equal to about 50 nm, less than or equal to about for example about 45 nm, less than or equal to about 40 nm, or less than or equal to about 30 nm.

The quantum dot may have a particle size (e.g., a diameter or the largest linear length crossing the particle) of greater than or equal to about 1 nm and less than or equal to about 100 nm. The quantum dot may have a size of about 1 nm to about 50 nm. The quantum dot may have, for example, a size of greater than or equal to about 2 nm, greater than or equal to about 3 nm, or greater than or equal to about 4 nm. The quantum dot may have a size of less than or equal to about 50 nm, less than or equal to about 40 nm, less than or equal to about 30 nm, less than or equal to about 20 nm, or less than or equal to about 15 nm. A shape of the quantum dot is not particularly limited. For example, the shape of the quantum dot may be a sphere, an ellipsoid, a polyhedron, a pyramid, a multipod, a square, a rectangular parallelepiped, a nanotube, a nanorod, a nanowire, a nanosheet, or a combination thereof, but is not limited thereto.

The quantum dot may be commercially available or may be appropriately synthesized. When quantum dot is colloid-synthesized, the particle size may be relatively freely controlled and also uniformly controlled. When quantum dot has a size of less than or equal to about 10 nm, the quantum confinement effects in which the bandgap is more increased according to decreasing a size become significant, thus the energy density is enhanced. In a colloid synthesis, precursor materials are reacted in an organic solvent to grow crystal particles and the organic solvent or a ligand compound may coordinate on the surface of the quantum dot, controlling the growth of the particle. Specific types of the organic solvent and the ligand compound are known. Excess organic materials (e.g., organic solvent/ligand, etc.) that are not coordinated on the surface of the quantum dots after synthesis may be removed by reprecipitation using an excessive amount of a non-solvent. Examples of the non-solvent may be acetone, ethanol, methanol, and the like, but are not limited thereto.

The quantum dot may include an organic ligand having a hydrophobic group and not having a photopolymerizable group. The organic ligand group may be bound to a surface of the quantum dot. The organic ligand may include $RCOOH$, $RNH_2$, $R_2NH$, $R_3N$, $RSH$, $R_3PO$, $R_3P$, $ROH$, $RCOOR'$, $RPO(OH)_2$, $RHPOOH$, $R_2POOH$ (wherein, R and R' are independently a C1 to C40 (or to C24) substituted or unsubstituted aliphatic hydrocarbon group such as a C3 to C40 (or to C24) alkyl or alkenyl group, a C6 to C40 (or to C20) substituted or unsubstituted aromatic hydrocarbon group such as a C6 to C40 (or to C20) aryl group), or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as substituted or unsubstituted methyl phosphine, substituted or unsubstituted ethyl phosphine, substituted or unsubstituted propyl phosphine, substituted or unsubstituted butyl phosphine, substituted or unsubstituted pentyl phosphine, substituted or unsubstituted octylphosphine, substituted or unsubstituted dioctyl phosphine (e.g., trioctylphosphine (TOP)), substituted or unsubstituted tributylphosphine, or substituted or unsubstituted trioctylphosphine; a phosphine compound or an oxide compound thereof such substituted or unsubstituted methyl phosphine oxide, substituted or unsubstituted ethyl phosphine oxide, substituted or unsubstituted propyl phosphine oxide, substituted or unsubstituted butyl phosphine oxide, substituted or unsubstituted pentyl phosphine oxide, substituted or unsubstituted tributylphosphine oxide, substituted or unsubstituted octylphosphine oxide, substituted or unsubstituted dioctyl phosphineoxide, or substituted or unsubstituted trioctylphosphineoxide (e.g., trioctylphosphineoxide (TOPO)); a diphenyl phosphine compound, triphenyl phosphine compound, or an oxide compound thereof; C5 to C20 alkyl phosphonic acid such as hexylphosphinic acid, octylphosphinic acid, dodecanephosphinic acid, tetradecanephosphinic acid, hexadecanephosphinic acid, octadecanephosphinic acid; or the like, but are not limited thereto. The quantum dot may include a hydrophobic organic ligand alone or in a combination of two or more. The hydrophobic organic ligand may not include a photopolymerizable group (e.g., a (meth)acrylate group, etc.).

An amount of the quantum dots in the composition may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, 1 to greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, greater than or equal to about 24 wt %, or greater than or equal to about 25 wt % based on a total weight of solid contents. An amount of the quantum dot may be less than or equal to about 70 wt %, for example, less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 19 wt %, less than or equal to about 17 wt %, or less than or equal to about 15 wt % based on a total weight of solid contents.

When the quantum dot is simply mixed with an alkali developable photoresist without any surface treatment, significant agglomeration of the quantum dots may occur. In order for a patterned quantum dot-polymer composite to be used as a color filter, a relatively large amount of quantum dots may be required to be included in the composite. If quantum dots are not dispersed well, it may be difficult to form a pattern of quantum dots. In the composition of an embodiment, the quantum dots including an organic ligand (e.g., having a hydrophobic moiety) on a surface thereof is dispersed in a binder polymer solution including a COOH group solution to provide a quantum dot-binder dispersion and then mixed with other components of alkali-developable photoresist (e.g., photopolymerizable monomer, initiator and the like). Thereby, in the composition of an embodiment, the quantum dots (e.g., relatively large amount of quantum dots) may be dispersed in the alkali developable photoresist without the serious agglomeration. Without wishing to be bound by any theory, it is believed that the quantum dots which are preliminarily dispersed by the binder may keep its enhanced dispersibility even in the alkali developable photoresist.

The composition of an embodiment includes a quantum dot dispersion, and the quantum dot dispersion includes a binder polymer including a —COOH group and a plurality of quantum dots which are dispersed (e.g., separated from each other) by the binder polymer. The composition of an embodiment may provide a quantum dot-polymer composite pattern even with no the polymerizable functional group (e.g., (meth)acrylate) on a surface thereof, and thus the surface treatment of the quantum dot may be omitted, and the organic solvent such as toluene, NMP, and the like may be excluded from the developing process.

The second stabilizer or the binder polymer including a carboxylic acid group (—COOH) may be a copolymer (hereinafter, also referred to as "carboxylic acid copolymer") derived from a monomer combination including a first monomer including a carboxylic acid group and a carbon-carbon double bond, a second monomer having a carbon-carbon double bond and a hydrophobic moiety and not having a carboxylic acid group, and optionally a third monomer having a carbon-carbon double bond and a hydrophilic moiety and not having a carboxylic acid group; a multiple-aromatic ring-containing polymer (hereinafter, also referred to as multi-aromatic ring-containing polymer) including a carboxylic acid group (—COOH) and having a backbone structure wherein two aromatic rings are bound to a quaternary carbon atom being a constituent atom of another cyclic group in the main chain, i.e., comprising cyclic groups in the main chain, wherein the cyclic groups comprise a quaternary carbon atom wherein two aromatic rings are bound to the quaternary carbon atom, and a carboxylic acid group linked to the main chain; or a combination thereof.

The carboxylic acid copolymer includes a first repeating unit derived from the first monomer, a second repeating unit derived from the second monomer, and optionally a third repeating unit derived from the third monomer.

The first repeating unit may include a unit represented by Chemical Formula 1-1, a unit represented by Chemical Formula 1-2, or a combination thereof;

Chemical Formula 1-1

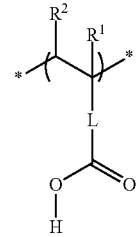

wherein, $R^1$ is a hydrogen atom, a C1 to C3 alkyl group, or —$(CH_2)_n$—COOH (n is 0 to 2), $R^2$ is a hydrogen atom, a C1 to C3 alkyl group, or —COOH, and L is a direct bond, a C1 to C15 aliphatic hydrocarbon group such as a C1 to C3 alkylene group, a C6 to C30 aromatic hydrocarbon group such as a C6 to C12 arylene group, a C3 to C30 alicyclic hydrocarbon group, a C6 to C30 aromatic hydrocarbon group, or a C1 to C15 aliphatic hydrocarbon group substituted with a C3 to C30 alicyclic hydrocarbon group, and * is a linking portion with an adjacent atom, Chemical Formula 1-2

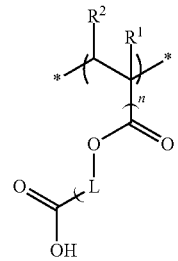

wherein, $R^1$ is a hydrogen atom, a C1 to C3 alkyl group, or —$(CH_2b$-COOH (n is 0 to 2), $R^2$ is a hydrogen atom or a C1 to C3 alkyl group, L is a C1 to C15 alkylene group, a C1 to C15 alkylene group wherein at least one methylene group is replaced by —CO—, —O—, or —COO—, a C6 to C30 aromatic hydrocarbon group, a C3 to C30 alicyclic hydrocarbon group, a C6 to C30 aromatic hydrocarbon group, or a C1 to C15 aliphatic hydrocarbon group substituted with a C3 to C30 alicyclic hydrocarbon group, n is an integer ranging from 1 to 3, and * is a linking portion with an adjacent atom.

As used herein, examples of the C3 to C30 alicyclic hydrocarbon group may be a cycloalkyl group such as a cyclohexyl group or a norbornyl group, a cycloalkenyl group such as a norbornenyl group, a cycloalkylene group such as cyclohexylene, or a norbornane group, or a cycloalkenylene group such as norbornene group, but are not limited thereto. As used herein, the C6 to C30 aromatic hydrocarbon group may include a C6 to C30 aryl group such as a phenyl group, naphthyl group, a C6 to C30 arylene group, and the like, but are not limited thereto. As used herein, the aliphatic hydrocarbon group may be for example, a C1 to C15 alkyl group such as a methyl group, an ethyl group, a propyl group, a C1-C15 alkylene group, and the like, but are not limited thereto.

The second repeating unit may include a unit represented by Chemical Formula 2, a unit represented by Chemical Formula 4, a unit represented by Chemical Formula 5, a unit represented by Chemical Formula A, or a combination thereof:

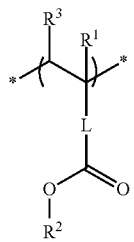

Chemical Formula 2 wherein, $R^1$ is a hydrogen atom or a C1 to C3 alkyl group, $R^2$ is a C1 to C15 aliphatic hydrocarbon group, a C6 to C30 aromatic hydrocarbon group, a C3 to C30 alicyclic hydrocarbon group, a C1 to C15 aliphatic hydrocarbon group substituted with a C3 to C30 alicyclic hydrocarbon group (e.g., arylalkyl group), $R^3$ is a hydrogen atom or a C1 to C3 alkyl group, and * Is a linking portion with an adjacent atom;

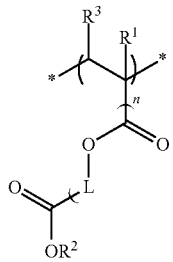

Chemical Formula 4 wherein, $R^1$ is a hydrogen atom or a C1 to C3 alkyl group, L Is a C1 to C15 alkylene group, a C1 to C15 alkylene group wherein at least one methylene group is replaced by —CO—, —O—, or —COO—, a C6 to C30 aromatic hydrocarbon group such as a C6 to C30 arylene group, a C3 to C30 alicyclic hydrocarbon group, a C6 to C30 aromatic hydrocarbon group, or a C1 to C15 aliphatic hydrocarbon group substituted with a C3 to C30 alicyclic hydrocarbon group, $R^2$ is a C1 to C15 aliphatic hydrocarbon group, a C6 to C30 aromatic hydrocarbon group, a C3 to C30 alicyclic hydrocarbon group, a C6 to C30 aromatic hydrocarbon group, or a C1 to C15 aliphatic hydrocarbon group substituted with a C3 to C30 alicyclic hydrocarbon group, $R^3$ is a hydrogen atom or a C1 to C3 alkyl group, n is an integer ranging from 1 to 3, and * Is a linking portion with an adjacent atom;

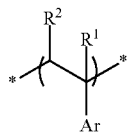

Chemical Formula 5 wherein, $R^1$ and $R^2$ are independently a hydrogen atom or a C1 to C3 alkyl group, Ar is a substituted or unsubstituted C6 to C30 aromatic hydrocarbon group or a substituted or unsubstituted C3 to C30 alicyclic hydrocarbon group, and * is a linking portion with an adjacent atom, and

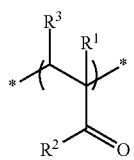

Chemical Formula A wherein, $R^1$ is a hydrogen atom or a C1 to C3 alkyl group, $R^2$ is a C1 to C15 aliphatic hydrocarbon group, a C6 to C30 aromatic hydrocarbon group, a C3 to C30 alicyclic hydrocarbon group, a C6 to C30 aromatic hydrocarbon group, or a C1 to C15 aliphatic hydrocarbon group substituted with a C3 to C30 alicyclic hydrocarbon group, $R^3$ is a hydrogen atom or a C1 to C3 alkyl group, and * is a linking portion with an adjacent atom.

The third repeating unit may be represented by Chemical Formula 3:

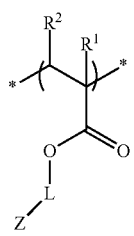

Chemical Formula 3 wherein, $R^1$ and $R^2$ are independently a hydrogen atom or a C1 to C3 alkyl group, L is a C1 to C15 alkylene group, a C1 to C15 alkylene group wherein at least one methylene group is replaced by —CO—, —O—, or —COO—, a C6 to C30 aromatic hydrocarbon group such as a C6 to C30 arylene group, or a C3 to C30 alicyclic hydrocarbon group, Z Is a hydroxy group (—OH), a mercapto group (—SH), or an amino group (—NHR, wherein R is a hydrogen atom or a C1 to C5 alkyl group).

Specific examples of the first monomer may include (meth)acrylic acid, crotonic acid, maleic acid, itaconic acid, fumaric acid, 3-butanoic acid, and carbonic acid vinyl ester compounds such as vinyl acetate, and vinyl benzoate, but are not limited thereto. The first monomer may be one or more compounds.

Specific examples of the second monomer may be alkenyl aromatic compounds such as styrene, α-methyl styrene, vinyl toluene, or vinyl benzyl methyl ether; unsaturated carbonic acid ester compounds such as methyl (meth)acrylate, ethyl (meth)acrylate, butyl (meth)acrylate, benzyl (meth)acrylate, cyclohexyl (meth)acrylate, or phenyl (meth)

acrylate; unsaturated carbonic acid amino alkyl ester compounds such as 2-amino ethyl (meth)acrylate, or 2-dimethyl amino ethyl (meth)acrylate; maleimides such as N-phenylmaleimide, N-benzylmaleimide, or N-alkylmaleimide; unsaturated carbonic acid glycidyl ester compounds such as glycidyl (meth)acrylate; vinyl cyanide compounds such as (meth)acrylonitrile; unsaturated amide compounds such as (meth)acrylamide, but are not limited thereto. The second monomer may be one or more compounds.

Specific examples of the third monomer may include 2 2-hydroxyethyl (meth)acrylate or 2-hydroxybutyl (meth)acrylate, but are not limited thereto. The third monomer may be one or more compounds.

In an embodiment, the second stabilizer or the binder polymer including a carboxylic acid group may be a copolymer of (meth)acrylic acid; and at least one of the second monomer or third monomer which is a (C7 to C13 arylalkyl) (meth)acrylate, a hydroxy(C1 to C6 alkyl) (meth)acrylate, or styrene.

In the carboxylic acid group-containing copolymer, an amount of the first repeating unit may be greater than or equal to about 5 mol %, for example, greater than or equal to about 10 mol %, greater than or equal to about 15 mol %, greater than or equal to about 25 mol %, or greater than or equal to about 35 mol %. In the binder polymer including a carboxylic acid group, an amount of the first repeating unit may be less than or equal to about 95 mol %, for example, less than or equal to 1 to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %. In the binder polymer including a carboxylic acid group, an amount of the second repeating unit may be greater than or equal to about 5 mol %, for example, greater than or equal to about 10 mol %, greater than or equal to about 15 mol %, greater than or equal to about 25 mol %, or greater than or equal to about 35 mol %. In the binder polymer including a carboxylic acid group, an amount of the second repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 40 mol %, less than or equal to about 35 mol %, or less than or equal to about 25 mol %. In the binder polymer including a carboxylic acid group, an amount of the third repeating unit may be greater than or equal to about 1 mol %, for example, greater than or equal to about 5 mol %, greater than or equal to about 10 mol %, or greater than or equal to about 15 mol %. In the binder polymer including a carboxylic acid group, an amount of the third repeating unit may be less than or equal to about 40 mol %, for example, less than or equal to about 30 mol %, less than or equal to about 25 mol %, less than or equal to about 20 mol %, less than or equal to about 18 mol %, less than or equal to about 15 mol %, or less than or equal to about 10 mol %.

The carboxylic acid copolymer may be a copolymer of (meth)acrylic acid and at least one of a (C7 to C30 arylalkyl) (math)acrylate, a (C1 to C30 hydroxyalkyl)(meth)acrylate, or styrene. For example, the binder polymer including a carboxylic acid group may be a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxyethyl (meth)acrylate copolymer, or a (meth)acrylic acid/benzyl (meth)acrylate/styrene/2-hydroxyethyl(math)acrylate copolymer. In an embodiment, methacrylic acid and methacrylate copolymers are used.

In the multi-aromatic ring-containing polymer for the second stabilizer or the binder polymer, the backbone structure may include a repeating unit represented by Chemical Formula B:

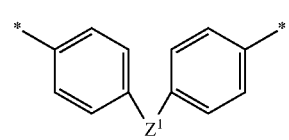

Chemical Formula B wherein, * * is a linking position with an adjacent atom of the main chain of the binder, $Z^1$ is one of the linking moieties represented by Chemical Formulae B-1 to B-6, and in Chemical Formulae 1-1 to 1-6, and * is a linking position with an aromatic moiety:

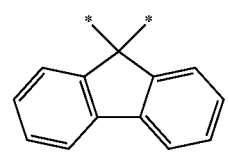

Chemical Formula B-1

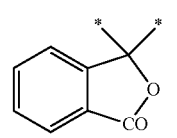

Chemical Formula B-2

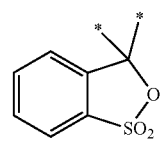

Chemical Formula B-3

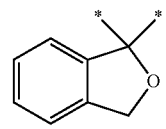

Chemical Formula B-4

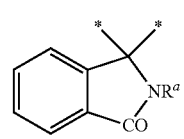

Chemical Formula B-5 wherein, $R^1$ is a hydrogen atom, an ethyl group, $C_2H_4Cl$, $C_2H_4OH$, $CH_2CH{=}CH_2$ or a phenyl group, Chemical Formula B-6

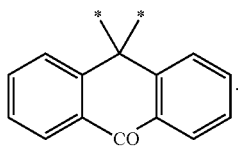

The multi-aromatic ring-containing polymer may include a repeating unit represented by Chemical Formula C:

Chemical Formula C

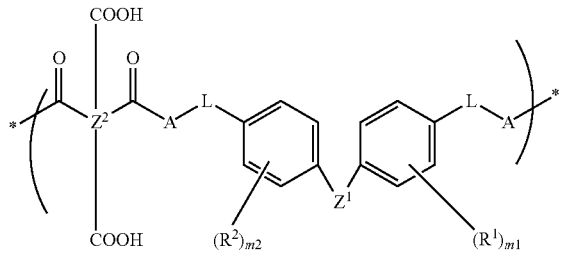

wherein, $Z^1$ is one of linking moieties represented by Chemical Formulae 1-1 to 1-6, L is a direct bond, C1 to C10 alkylene, a C1 to C10 alkylene having a substituent including a carbon-carbon double bond, a C1 to C10 oxyalkylene, or a C1 to C10 oxyalkylene having a substituent including a carbon-carbon double bond, A is —NH—, —O—, or a C1 to C10 alkylene, $Z^2$ is a C6 to C40 aromatic organic group, $R^1$ and $R^2$ are independently a hydrogen atom, a halogen, or a substituted or unsubstituted C1 to C20 alkyl group, and m1 and m2 are independently an integer ranging from 0 to 4.

In Chemical Formula C, $Z^2$ may be one of Chemical Formula C-1, Chemical Formula C—, and Chemical Formula C-3:

Chemical Formula C-1

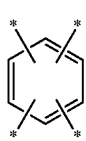

wherein, * is a linking position with an adjacent carbonyl carbon,

Chemical Formula C-2

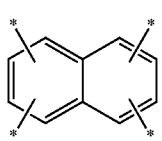

wherein, * is a linking position with an adjacent carbonyl carbon,

Chemical Formula C-3

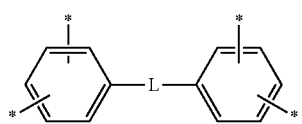

wherein, * is a linking position with an adjacent carbonyl carbon, L is a direct bond, —O—, —S—, —C(=O)—, —CH(OH)—, —S(=O)$_2$—, —Si(CH$_3$)$_2$—, (CH$_2$)$_p$ (wherein, 1≤p≤10), (CF$_2$)$_q$ (wherein, 1≤q≤10), —CR$_2$— (wherein, R is independently, a hydrogen atom, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multi-aromatic ring-containing polymer may include a structural unit represented by Chemical Formula D;

Chemical Formula D

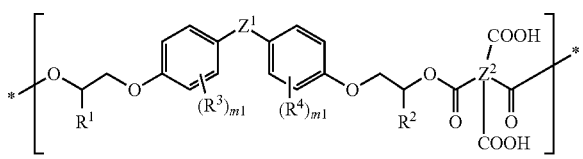

wherein, $R^1$ and $R^2$ are independently a hydrogen atom or a substituted or unsubstituted (meth)acryloyloxyalkyl group, $R^3$ and $R^4$ are independently a hydrogen atom, a halogen, or a substituted or unsubstituted C1 to C20 alkyl group, $Z^1$ is one of the linking moieties represented by Chemical Formulae B-1 to B-6, $Z^2$ is an aromatic organic group, and is for example the same as the moieties described above, and m1 and m2 are independently an integer ranging from 0 to 4.

In an embodiment, the multi-aromatic ring-containing polymer may be an acid addition product of bisphenolfluorene epoxy (meth)acrylate, specifically a bisphenolfluorene epoxy acrylate. For example, the bisphenol fluorene epoxy acrylate may be prepared by reacting 4,4-(9-fluorenylidene)-diphenol and epichlorohydrin to obtain an epoxy compound having a fluorene group, and the epoxy compound is reacted with an acrylic acid to obtain a fluorenyl epoxy acrylate, which is then further reacted with biphenyldianhydride and/or phthalic anhydride. The reaction scheme may be summarized as below.

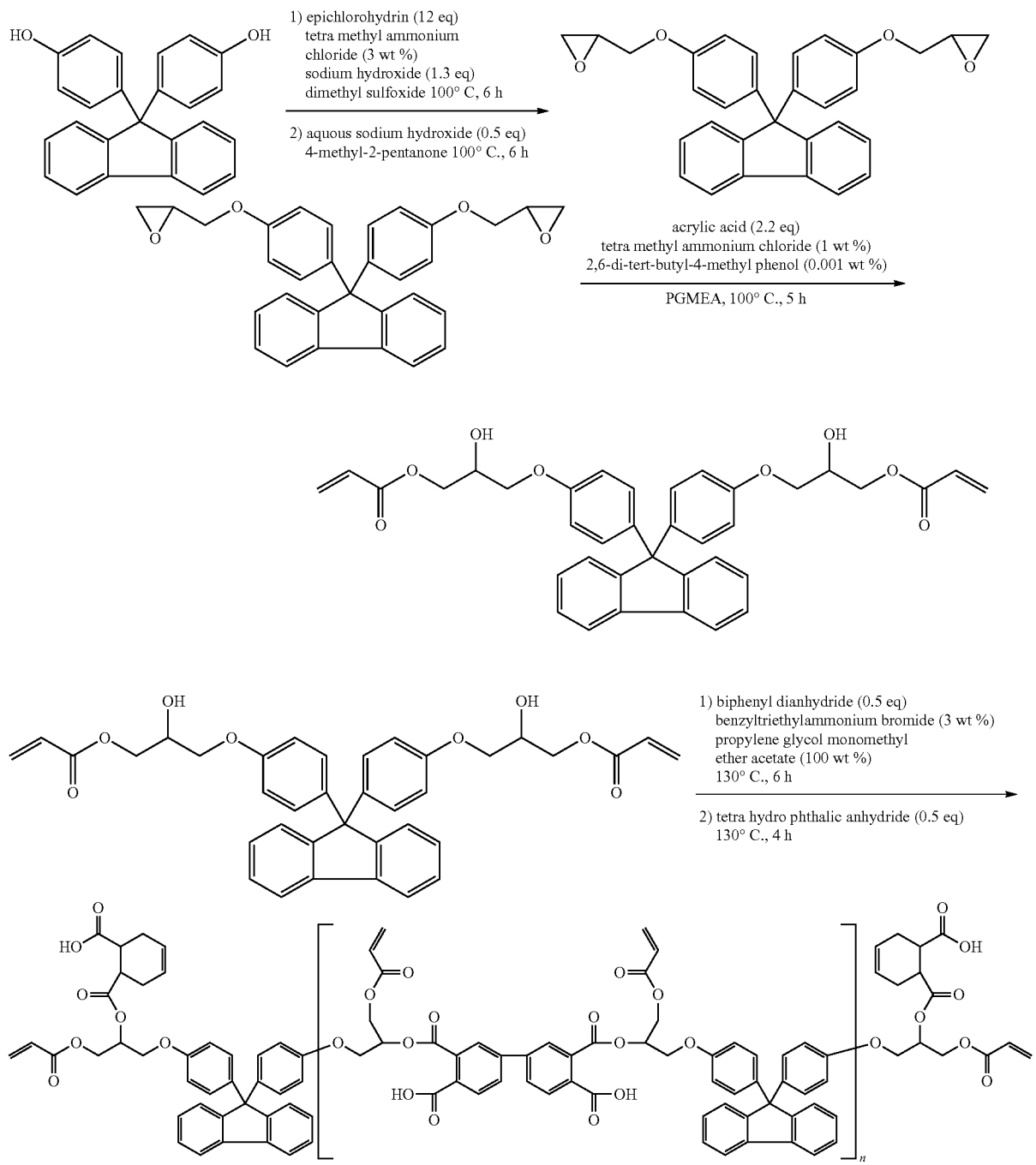

The multi-aromatic ring-containing polymer may include a functional group represented by Chemical Formula E at one or both terminal ends:

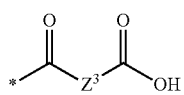

Chemical Formula E wherein $Z^3$ is a group represented by one of Chemical Formulae E-1 to E-7:

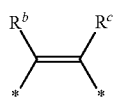

Chemical Formula E-1 wherein, $R^b$ and $R^c$ are independently a hydrogen atom, a substituted or unsubstituted C1 to C20 alkyl group, an ester group, or an ether group.

Chemical Formula E-2

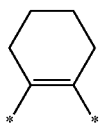

Chemical Formula E-3

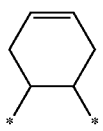

Chemical Formula E-4

Chemical Formula E-5

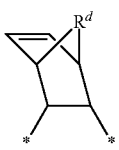

wherein, $R^d$ is O, S, NH, a substituted or unsubstituted C1 to C20 alkylene group, a C1 to C20 alkylamine group, or a C2 to C20 alkenylamine group.

Chemical Formula E-6

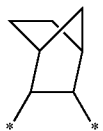

Chemical Formula E-7

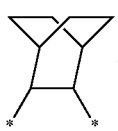

The multi-aromatic ring-containing polymer may be synthesized by a known method or is commercially available (e.g., from Nippon Steel Chemical Co., Ltd.).

The multi-aromatic ring-containing polymer may include a reaction product of a fluorene compound such as 9,9-bis(4-hydroxyphenyl)fluorene, 9,9-bis(4-aminophenyl)fluorene, 9,9-bis[4-(glycidyloxy)phenyl]fluorene, or 9,9-bis[4-(2-hydroxyethoxy)phenyl]fluorene with an appropriate compound capable of reacting with the fluorene compound (e.g., an aromatic dianhydride such as 9,9-bis-(3,4-dicarboxyphenyl)fluorene dianhydride, pyromellitic dianhydride (PMDA), biphenyltetracarboxylic dianhydride (BPDA), benzophenoltetracarboxylic dianhydride, or naphthalenetetracarboxylic dianhydride; a C2 to C30 diol compound; epichlorohydrin; or the like).

The fluorene compound, dianhydrides, a diol compound, and the like are commercially available, and the reaction conditions therebetween are known in the art.

The second stabilizer or the binder polymer including a carboxylic acid group may have a molecular weight of greater than or equal to about 1000 g/mol, for example, greater than or equal to about 2000 g/mol, greater than or equal to about 3000 g/mol, or greater than or equal to about 5000 g/mol. The binder polymer including a carboxylic acid group may have a molecular weight of less than or equal to about 100000 g/mol, for example, less than or equal to about 90000 g/mol, less than or equal to about 80000 g/mol, less than or equal to about 70000 g/mol, less than or equal to about 60000 g/mol, less than or equal to about 50000 g/mol, less than or equal to about 40000 g/mol, less than or equal to about 30000 g/mol, less than or equal to about 20000 g/mol, or less than or equal to about 10000 g/mol. Within the ranges, more improved developability may be obtained.

An amount of the binder polymer including a carboxylic acid group may be greater than or equal to about 0.5 wt %, for example, greater than or equal to about 1 wt %, 2 wt %, greater than or equal to about 3 wt %, greater than or equal to about 4 wt %, greater than or equal to about 5 wt %, greater than or equal to about 10 wt %, greater than or equal to about 15 wt %, or greater than or equal to about 20 wt %, based on a total weight of solid contents. An amount of the binder polymer including a carboxylic acid group may be less than or equal to about 70 wt %, for example, 65 wt %, less than or equal to about 60 wt %, less than or equal to about 59 wt %, less than or equal to about 58 wt %, less than or equal to about 57 wt %, less than or equal to about 56 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 29 wt %, less than or equal to about 28 wt %, less than or equal to about 27 wt %, less than or equal to about 26 wt %, less than or equal to about 25 wt %, less than or equal to about 24 wt %, less than or equal to about 23 wt %, less than or equal to about 22 wt %, or less than or equal to about 21 wt % based on a total weight of the composition. Within the ranges, an appropriate developability and processibility during a post pattern forming process may be realized while ensuring dispersion of quantum dots.

The composition of an embodiment includes a polymerizable monomer including at least one carbon-carbon double bond (e.g., a (meth)acrylate group), for example, two, three, four, five, six, or more carbon-carbon double bonds. Types of the polymerizable monomer is not particularly limited as long as it Includes a carbon-carbon double bond and polymerizable by light. For example, the polymerizable monomer may be a monofunctional or multi-functional ester of (meth) acrylic acid having at least one ethylenically unsaturated double bond, as a generally-used monomer or oligomer of a photosensitive resin composition. For example, the polymerizable monomer may be a vinyl monomer, a unsaturated ethylene oligomer, a homopolymer thereof, or a copolymer of the unsaturated ethylene oligomer and the ethylenically unsaturated monomer.

Specific examples of the polymerizable monomer may be alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy acrylate, bisphenol A di(meth)acrylate, trimethylolpropane tri(meth)acrylate, novolac poly(meth)acrylate, ethylene glycol monomethyl ether (meth)acrylate, tris(meth)acryloyloxyethyl phosphate, or propylene glycol di(meth)acrylate, but are not limited thereto. The polymerizable monomer according to an embodiment may include a di(meth)acrylate compound, a tri(meth)acrylate compound, a tetra(meth)acrylate compound, a penta(meth)acrylate compound, a hexa(meth) acrylate compound, or a combination thereof.

In the composition, an amount of the polymerizable monomer may be greater than or equal to about 0.5 wt %, for example, greater than or equal to about 1 wt %, or greater than or equal to about 2 wt % based on a total weight of solid contents. An amount of the polymerizable monomer may be less than or equal to about 75 wt %, for example, 70 wt %, less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 10 wt % based on a total weight of solid contents.

The composition includes an initiator (e.g., photoinitiator). The Initiator included in the composition is a compound capable of initiating a radical polymerization. Types of the initiator are not particularly limited, and may be selected appropriately. For example, the available initiator may be a triazine compound, an acetophenone compound, a benzophenone compound, a thioxanthone compound, a benzoin compound, an oxime compound, or a combination thereof, but it is not limited thereto.

Examples of the triazine compound may include 2,4,6-trichloro-s-triazine, 2-phenyl-4,6-bis(trichloro methyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloro methyl)-s-triazine, 2,4-bis(trichloromethyl)-6-styryl-s-triazine, 2-(naphth-1-yl)-4,6-bis(trichloromethyl)-s-triazine, 2-(4-methoxy naphth-1-yl)-4,6-bis(trichloro methyl)-s-triazine, 2,4-trichloromethyl (piperonyl)-6-triazine, 2,4-trichloro methyl(4'-methoxystyryl)-6-triazine but are not limited thereto. Examples of the acetophenone compound may be 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholino phenyl)-butan-1-one, but are not limited thereto. Examples of the benzophenone compound may be benzophenone, benzoyl benzoate, benzoyl benzoate methyl, 4-phenylbenzophenone, hydroxybenzophenone, acrylated benzophenone, 4,4'-bis(dimethylamino)benzophenone, 4,4'-dichlorobenzophenone, or 3,3'-dimethyl-2-methoxybenzophenone but are not limited thereto. Examples of the thioxanthone compound may be thioxanthone, 2-methylthioxanthone, 2-isopropylthioxanthone, 2,4-diethyithioxanthone, 2,4-diisopropylthioxanthone, 2-chloro thioxanthone, and the like, but are not limited thereto.

Examples of the benzoin compound may include benzoin, benzoin methyl ether, benzoin ethyl ether, benzoin isopropyl ether, benzoin isobutyl ether, or benzyl dimethyl ketal, but are not limited thereto.

Examples of the oxime compound may include 2-(o-benzoyloxime)-1-[4-(phenylthio)phenyl]-1,2-octandione and 1-(o-acetyloxime)-1-[9-ethyl-6-(2-methylbenzoyl)-9H-carbazol-3-yl]ethanone, but are not limited thereto.

The initiator may also include a carbazole compound, a diketone compound, a sulfonium borate compound, a diazo compound, a biimidazole compound, and the like, in addition to the initiator.

In the composition, an amount of the initiator may be greater than or equal to about 0.01 wt %, for example, greater than or equal to about 0.1 wt %, or greater than or equal to about 1 wt % based on a total weight of solid contents. An amount of the initiator may be less than or equal to about 15 wt %, for example, 10 wt %, less than or equal to about 5 wt % based on a total weight of the composition. An amount of the initiator may be appropriately selected considering a pattern-forming capability.

The composition of an embodiment may further include a multi-thiol compound having at least two thiol end groups. The multi-thiol compound may be represented by Chemical Formula 6:

Chemical Formula 6 wherein, in Chemical Formula 6, each $R^1$ is the same or different, and is a hydrogen atom; a substituted or unsubstituted C1 to C30 straight or branched alkyl group; a substituted or unsubstituted C6 to C30 aryl group; a substituted or unsubstituted C7 to C30 arylalkyl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently a hydrogen atom or a C1 to C30 straight or branched alkyl group); an isocyanate group; a halogen; —ROR' (wherein R is a substituted or unsubstituted C1 to C20 alkylene group and R' is a hydrogen atom or a C1 to C20 straight or branched alkyl group); acyl halide (—RC(=O)X, wherein R is a substituted or unsubstituted alkylene group and X is a halogen); —C(=O)OR' (wherein R' is a hydrogen atom or a C1 to C20 straight or branched alkyl group); —CN; —C(=O)ONRR' (wherein R and R' are independently a hydrogen atom or a C1 to C20 straight or branched alkyl group), or a combination thereof, $L_1$ is a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, wherein at least one methylene (—$CH_2$—) included in the substituted or unsubstituted C1 to C30 alkylene group may be optionally replaced by sulfonyl (—$SO_2$—), carbonyl (CO), ether (—O—), sulfide (—S—), sulfoxide (—SO—), ester (—C(=O)O—), amide (—C(=O)NR—) (wherein R is a hydrogen atom or a C1 to C10 alkyl group), or a combination thereof, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene (—$CH_2$—) is to replaced by a sulfonyl (—$S(=O)_2$—), a carbonyl (—C(=O)—), an ether (—O—), a sulfide (—S—), a sulfoxide (—S(=O)—), an ester (—C(=O)O—), an amide (—C(=O)NR—) (wherein R is a hydrogen atom or a C1 to C10 straight or branched alkyl group), an imine (—NR—) (wherein R is a hydrogen atom or a C1 to C10 straight or branched alkyl group), or a ucombination thereof, m is an integer of 1 or more, k1 is 0 or an integer of 1 or more, k2 is an integer of 1 or more, and the sum of m and k2 is an integer of 3 or more, provided that when $Y_1$ is not a single bond, m does not exceed the valence of $Y_1$ and provided that the sum of k1 and k2 does not exceed the valence of Li.

The multi-thiol compound may include a compound represented by Chemical Formula 6-1:

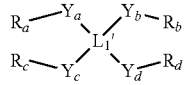

Chemical Formula 6-1 wherein, in Chemical Formula 6-1, $L_1'$ is a carbon atom, a substituted or unsubstituted C2 to C20 alkylene group, a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are independently a direct bond; a substituted or unsubstituted C1 to C30 alkylene group; a substituted or unsubstituted C2 to C30 alkenylene group; or a C1 to C30 alkylene group or a C2 to C30 alkenylene group wherein wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is a hydrogen atom or a C1 to C10 straight or branched alkyl group), imine (—NR—) (wherein R is a hydrogen atom or a C1 to C10 straight or branched alkyl group) or a combination thereof, each of $R_a$ to $R_d$ is independently $R^1$ of Chemical Formula 6 or SH, provided that at least two of $R_a$ to $R_d$ are SH.

The multi-thiol compound may react with a photopolymerizable monomer without an adverse effect on the dispersion of quantum dots, and thereby prevent the heat treatment (e.g., post-baking), which is accompanied by the photoresist process, from deteriorating the luminous efficiency of the quantum dots dispersed in the pattern. Without wishing to be bound by any theory, it is believed that the multi-thiol compound may allow the polymer to form a denser network by further reacting with the polymerizable monomer described later. In addition, the multi-thiol compound may provide a bond between the quantum dots and the photopolymerizable monomers to ensure the dispersion and the stability of the quantum dots in the composite. A pattern formed from the photosensitive resin composition including the multi-thiol compound may enhance the light emitting properties (such as a property of maintaining the blue-photoconversion efficiency), for example, by at least about 2 times in comparison with the composite without the reactive compound. In some embodiments, the photosensitive composition may maintain a blue photoconversion efficiency of greater than or equal to about 40%, for example, greater than or equal to about 45%, greater than or equal to about 60%, greater than or equal to about 70%, greater than or equal to about 80%, greater than or equal to about 90% of the initial value (e.g., photo-conversion efficiency after pre-baking) when it is developed by an alkali aqueous solution and then dried and heated at 180° C. for 30 minutes.

The multi-thiol compound may be a dithiol compound, a trithiol compound, a tetrathiol compound, or a combination thereof. For example, the multi-thiol compound may be glycol di-3-mercaptopropionate, glycol dimercapto acetate, trimethylolpropane tris(3-mercaptopropionate), pentaerythritol tetrakis(3-mercaptoproplonate), pentaerythritol tetrakis (2-mercaptoacetate), 1,6-hexanedithiol, 1,3-propane dithiol, 1,2-ethane dithiol, polyethylene glycol dithiol including 1 to 10 ethylene glycol repeating units, or a combination thereof.

An amount of the multi-thiol compound in the composition may be greater than or equal to about 0.5 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total weight of solid contents. An amount of the multi-thiol compound may be less than or equal to about 55 wt %, for example, less than or equal to about 50 wt %, less than or equal to about 40 wt %, less than or equal to about 35 wt %, less than or equal to about 30 wt %, or less than or equal to about 27 wt % based on a total weight of solid contents. The amount of the multi-thiol compound may be determined considering patternability and stability.

If desired, the composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on the composition and the pattern obtained therefrom.

For example, if it is present, an amount of the additive may be greater than or equal to about 0.001 wt % and less than or equal to about 40 wt % based on a total weight of solid contents, but is not limited thereto.

The light diffusing agent may include inorganic oxide particles such as alumina, silica, zirconia, titanium oxide particulates, or zinc oxide, and metal particles such as gold, silver, copper, or platinum, but is not limited thereto.

The leveling agent is aimed to prevent stains or spots and to improve leveling characteristics of a film, and examples thereof may include the following but are not limited thereto.

Examples of a fluorine leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

Types and amounts of the additive may be adjusted as necessary.

The coupling agent is aimed to increase adherence with respect to the substrate and may include a silane-based coupling agent. Examples of the silane-based coupling agent may be vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like.

The composition may include a solvent. The solvent may be included in quantum dot dispersion. An amount of the solvent may be determined considering the amounts of the main components (i.e., the quantum dot including an organic ligand, the COOH group-containing binder, the multi-thiol compound, the photopolymerizable monomer, and the photoinitiator), and other additives. The composition may include a balance amount of the solvent except amounts of desirable solids (non-volatiles). The solvent may be appropriately selected considering affinity for other components in the composition (e.g., the binder, the photopolymerizable monomer, the photoinitiator, or other additive), affinity for alkali developing solution, and boiling points, and the like. Examples of the solvent may be ethylene glycols such as ethyl 3-ethoxy propionate, ethylene glycol, diethylene glycol, or polyethylene glycol; glycol ethers such as ethylene glycol monomethylether, ethylene glycol monoethylether, diethylene glycol monomethylether, ethylene glycol diethylether, or diethylene glycol dimethylether; glycol ether acetates such as ethylene glycol acetate, ethylene glycol monoethylether acetate, diethylene glycol monoethylether acetate, or diethylene glycol monobutylether acetate; propylene glycols such as propylene glycol; propylene glycol ethers such as propylene glycol monomethylether, propylene glycol monoethylether, propylene glycol monopropylether, propylene glycol monobutylether, propylene glycol dimethylether, dipropylene glycol dimethylether, propylene glycol diethylether, or dipropylene glycol diethylether; propylene glycol ether acetates such as propylene glycol monomethyl ether acetate, or dipropylene glycol monoethylether acetate; amides such as N-methylpyrrolidone, dimethyl formamide, or dimethyl acetamide; ketones such as methylethylketone (MEK), methylisobutylketone (MIBK), or cyclohexanone; petroleum products such as toluene, xylene, or solvent naphtha; esters such as ethyl acetate, butyl acetate, or ethyl lactate; ethers such as diethyl ether, dipropyl ether, and dibutyl ether; and a combination thereof.

A method of preparing a composition according to an embodiment includes
preparing a binder solution including a binder polymer including a carboxylic acid group (—COOH) and a solvent; mixing a plurality of quantum dots with the binder solution to obtain quantum dot dispersion; mixing a metal oxide particle, a first stabilizer, a second stabilizer, and a solvent to mechanically treat (e.g., stir, mill, etc.) to obtain dispersion of the surface-treated metal oxide particle; and mixing the quantum dot dispersion with the multi-thiol compound, the photopolymerizable monomer, the photoinitiator, and the metal oxide particle dispersion.

A mixing/mechanical treating method is not particularly limited and may be appropriately selected. For example, each component may be mixed sequentially or simultaneously.

The preparing method may further include selecting a quantum dot (e.g., quantum dot including an organic ligand having a hydrophobic group on a surface thereof), and selecting a binder polymer including a carboxylic acid group (—COOH) capable of dispersing the quantum dots. In selecting the binder, the binder polymer including a carboxylic acid group may be a copolymer of a monomer combination of a first monomer including a carboxylic acid group and a carbon-carbon double bond and a second monomer including a carbon-carbon double bond and a hydrophobic group and not including a carboxylic acid group, and a chemical structure and an acid value of the copolymer may be considered.

The surface-treated metal oxide particle, the quantum dot, the binder polymer including a carboxylic acid group, the photopolymerizable monomer, the photoinitiator, and the quantum dot dispersion are the same as described above.

The composition is subject to polymerization (e.g., by light irradiation) to obtain a quantum dot-polymer composite. The composition may form a pattern of a quantum dot-polymer composite via photolithography. The composition may form a pattern of a quantum dot-polymer composite via an ink jet process.

In an embodiment, when the composition is used, a quantum dot-polymer composite pattern may be formed without using an organic solvent developer. A non-limiting method of forming a pattern is explained referring to FIG. 1.

The composition is coated on a predetermined substrate (e.g., a glass substrate or a glass substrate coated with a predetermined thickness of $SiN_x$ (protective layer) (e.g., 500 to 1,500 Angstroms (Å) of the protective layer)) in an appropriate manner such as spin coating, slit coating, and the like to form a film of a predetermined thickness (e.g., a thickness of greater than or equal to about 3 micrometers (μm) and less than or equal to about 30 μm). The formed film may be pre-baked, at a temperature near or below the boiling point of the solvent as used) if desired. The specific conditions (such as a temperature, a duration, and an atmosphere) for pre-baking may be appropriately selected. The formed (or optionally, pre-baked) film is exposed to light of a predetermined wavelength under a mask having a predetermined pattern. The wavelength and the Intensity of light may be selected depending on the types and the amounts of the photoinitiator, the types and the amounts of quantum dots, or the like.

The exposed selected area of the film is treated (e.g., sprayed or immersed) with an alkali developing solution, and thereby the unexposed region in the film is dissolved to provide a desired pattern. The alkali developing solution may be an alkali aqueous solution (e.g., potassium hydroxide or sodium hydroxide aqueous solution) having pH of greater than or equal to about 8, greater than or equal to about 9, greater than or equal to about 10, or greater than or equal to about 11 and less than or equal to about 13, or less than or equal to about 12. When using the composition of an embodiment, the obtained composite may exhibit improved re-solubility for an alkali developing solution even in the case of including the increased-amount of quantum dots and metal oxide particles. Thus, when being treated with the alkali developing solution, the non-exposed region of the exposed film may be dissolved without any substantial generation of composite flakes having a size of several hundred micrometer (e.g., greater than or equal to about 100 m, greater than or equal to about 200 &m, greater than or equal to about 300 μm, greater than or equal to about 400 n, greater than or equal to about 500 j m, or even greater than or equal to about 0.1 millimeters). A treated solution including the dissolved composite after the development may be filtered through a filter having pores of hundreds micron size without blocking the filter.

The obtained pattern may be post-baked, if desired, to improve crack resistance and solvent resistance of the pattern, for example, at a temperature of about 150° C. to about 230° C. for a predetermined time (e.g., greater than or equal to about 10 minutes or greater than or equal to about 20 minutes). Even after the performing of the post-bake process, the pattern obtained from the composition may show Improved thermal stability, so that a maintenance ratio may be 40% or greater, for example, 50% or greater, 60% or greater, or 70% or greater. As used herein, the term "maintenance ratio" is a percentage of the photoconversion efficiency of a quantum dot-polymer composite or a pattern thereof after a heat treatment at a temperature of about 180° C. for 30 minutes with respect to the photoconversion efficiency after being prebaked.

When a quantum dot-polymer composite obtained from the composition is used as a color filter, two or three types of photosensitive compositions each including red light emitting quantum dots, green light emitting quantum dots, (or optionally, blue light emitting quantum dots) are prepared, and the patterning process is repeated as many times as necessary (e.g., two times or three times) for each composition to provide a quantum dot-polymer composite having a desirable pattern.

The produced quantum dot-polymer composite (or a pattern thereof) includes a polymer matrix; and a plurality of quantum dots and a plurality of metal oxide particles dispersed in the polymer matrix, wherein the metal oxide particle includes a first stabilizer and a second stabilizer on a surface thereof. The quantum dot and the surface-treated metal oxide particles are the same as described above. The polymer matrix may include the binder polymer and a polymerization product of the polymerizable monomer (and optionally the multi-thiol compound). Accordingly, the polymer matrix may include a cross-linked polymer and a binder polymer including a carboxylic acid group. The cross-linked polymer may include a thiolene resin, a cross-linked poly((meth)acrylate), or a combination thereof. The quantum dot-polymer composite may have a photo-conversion efficiency of greater than or equal to about 50% (e.g., greater than or equal to about 60%, greater than or equal to about 70%, greater than or equal to about 80%, or greater than or equal to about 85%) of an initial value thereof after a 30 minute heat-treatment at a temperature of 180° C. The quantum dot-polymer composite may be a pattern.

In another embodiment, a layered structure includes a (e.g., transparent) substrate and an emissive layer disposed on the substrate, and the emissive layer includes a pattern of a quantum dot-polymer composite. The pattern of the quantum dot-polymer composite includes at least one repeating section emitting light in a predetermined wavelength. The quantum dot-polymer composite and the pattern thereof are the same as described above.

For example, a photoluminescent layer disposed on the substrate includes a quantum dot-polymer composite pattern including a plurality of quantum dots dispersed in a polymer matrix. The polymer matrix may include a cross-linked polymer; and linear polymer having a carboxylic acid-containing repeating unit. The cross-linked polymer may be a polymer cross-linked by light. In an embodiment, the layered structure may be a color filter.

The quantum dot-polymer composite pattern may include a first section emitting first light (e.g., red light in a wavelength region of about 600 nm to about 650 nm), a second section emitting second light (e.g., green light in a wavelength region of about 500 nm to 560 nm), and/or a third section emitting/transmitting third light (e.g., blue light in a wavelength region of less than about 500 nm or less than or equal to about 470 nm). The first section may include a red light emitting quantum dot. The second section may include a green light emitting quantum dot. The third section may include a blue light emitting quantum dot or may include a light transmitting resin.

At least a portion of the substrate may be configured to cut (absorb or reflect) blue light. A layer capable of blocking (e.g., absorbing or reflecting) blue light (blue cut layer) may be disposed on at least one surface of the substrate. For example, the blue cut layer (e.g., blue light absorption layer may) include an organic material and a predetermined dye (a yellow dye or a dye absorbing blue light and transmitting green and/or red light).

The substrate may be a substrate including an Insulation material (e.g., insulative transparent substrate). The transparent substrate may include an organic material, an Inorganic material, an organic/inorganic hybrid material, or a combination thereof. The transparent substrate may have a structure including an organic material (e.g., polymer layer) on a glass substrate.

The substrate may include various polymers of a polyester such as polyethylene terephthalate (PET) or polyethylene naphthalate (PEN), polycarbonate, poly((meth)acrylate), polyimide, a vinyl-based polymer having a carboxylic acid group, a polymer of thiol and ene compounds (hereinafter, thiolene polymer), or polyamide, but is not limited thereto. The substrate may include polysiloxane (e.g. PDMS) but is not limited thereto. The substrate may include a metal oxide such as $SiO_2$, $Al_2O_3$, or $ZnO$; a metal nitride, a metal oxynitride, or a combination thereof, but is not limited thereto. Herein, the term "transparent" refers to light transmittance of greater than or equal to about 85%, for example, greater than or equal to about 88%, greater than or equal to about 90%, greater than or equal to about 95%, greater than or equal to about 97%, or greater than or equal to about 99% for light emitted from a quantum dot (e.g., wavelength region of about 380 nm to about 780 nm). A thickness of the substrate may be appropriately selected considering a substrate material but is not particularly limited. The substrate may have flexibility.

In another embodiment, a display device (e.g., liquid crystal display) includes a light source, and a light emitting element including the aforementioned layered structure.

The light source may be configured to provide incident light to the light emitting element including the layered structure. The incident light may have a photoluminescent peak wavelength of about 440 nm to about 470 nm.

Figure 2A:
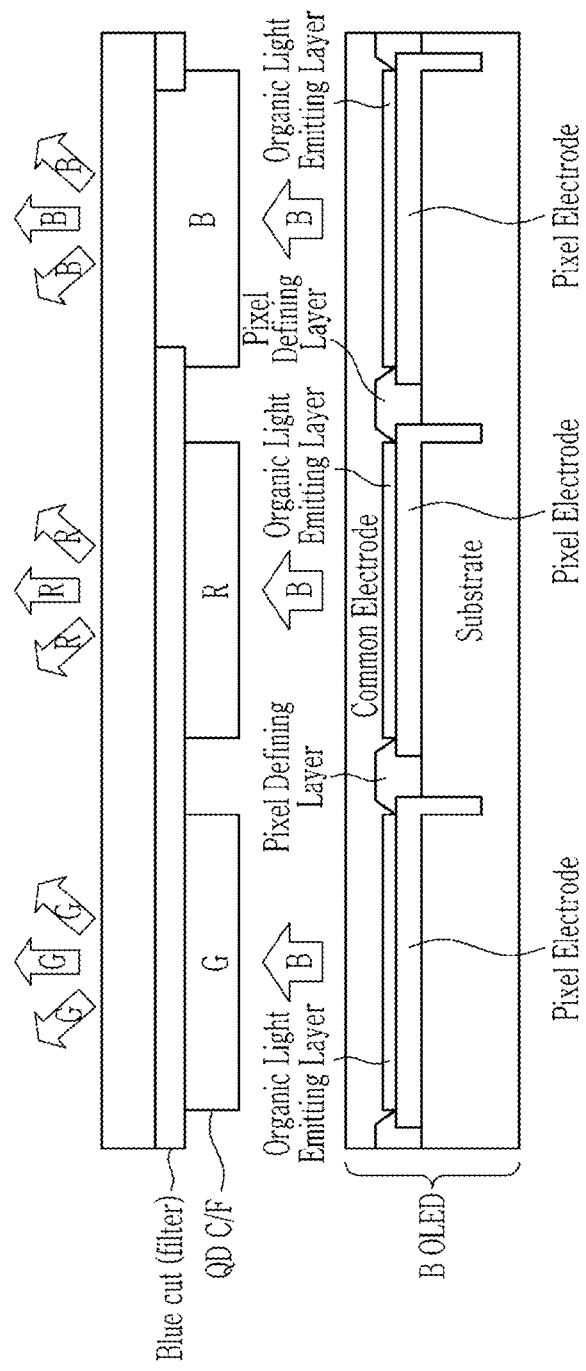
FIG. 2A is a schematic illustration showing a cross-section of a display device according to a non-limiting embodiment.
Figure 2B:
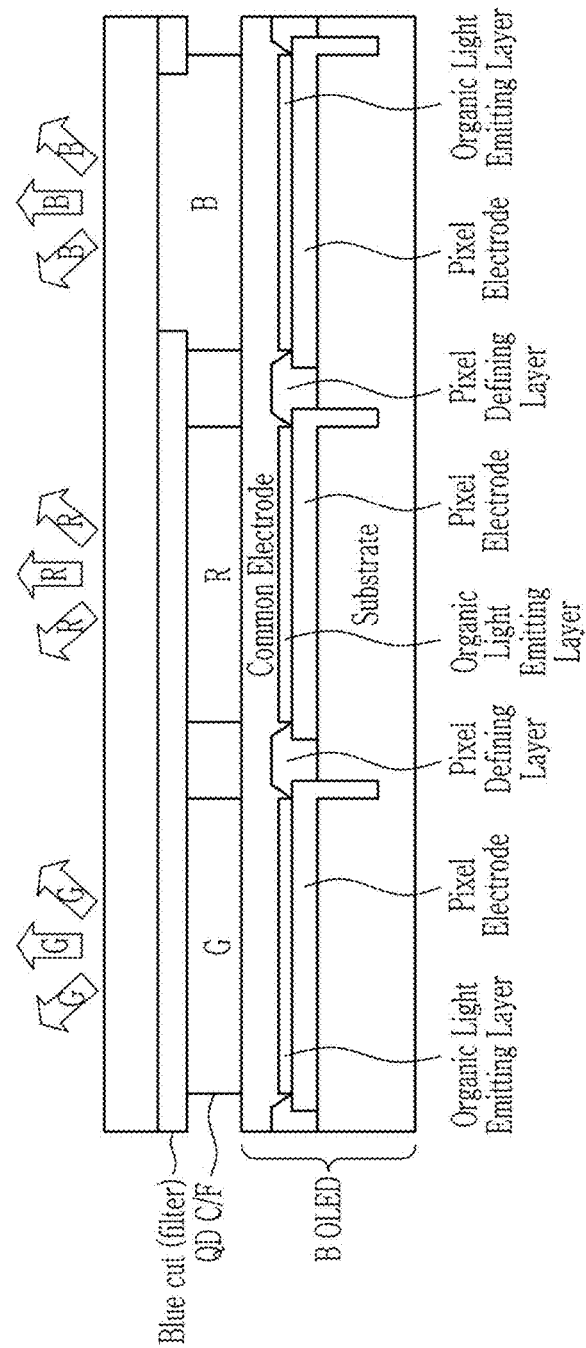
FIG. 2B is a schematic illustration showing a cross-section of a display device according to a non-limiting embodiment.

FIG. 2A and FIG. 2B show a schematic cross-sectional view of a display of an embodiment. Referring to FIG. 2A and FIG. 2B, the light source may include an (organic) light emitting diode (for example, emitting blue light or a light having a wavelength region of about 500 nm or less). The organic light emitting diode may include at least two pixel electrodes formed on a substrate, a pixel defining film formed between the adjacent pixel electrodes, and an organic light emitting layer formed on the pixel electrode, a common electrode layer formed on the organic light emitting layer.

A thin film transistor and a substrate may be disposed under the organic light emitting diode. The pixel areas of the OLED may be disposed corresponding to the first, second, and third sections that will be described in detail below, respectively.

On or over the light source, (for example, directly on the light source), the layered structure that includes a quantum dot-polymer composite pattern (e.g. including a first section including red light emitting quantum dots and/or a second section including green light emitting quantum dots) and a substrate or the quantum dot-polymer composite pattern may be disposed.

The light (e.g., blue light) emitted from the light source may enter the first and second sections of the pattern to emit (e.g., converted) red light and green light, respectively. The blue light emitted from the light source passes or transmits a third section. Over the first section emitting red light and/or the second section emitting green light, an optical element cutting (e.g., reflecting or absorbing) blue light (and optionally green light) (for example, a blue cut layer or a first optical filter) may be disposed. The blue cut layer may be disposed on the substrate. The blue cut layer may be disposed between the substrate and the quantum dot-polymer composite pattern and over the first section and the second section. Details of the blue cut layer are the same as set forth for the first optical filter below.

The display device may be fabricated by separately preparing the layered structure and (for example, the blue light emitting) OLED respectively and combining them. Alternatively, the device may be fabricated by directly forming the pattern of the quantum dot-polymer composite over the OLED.

In another embodiment, the display device may further include a lower substrate, a polarizer disposed below the lower substrate, and a liquid crystal layer interposed between the layered structure and the lower substrate. The layered structure is disposed in such a manner that a light emitting layer (i.e., the quantum dot-polymer composite pattern) face the liquid crystal layer. The display device may further include a polarizer between the liquid crystal layer and the light emitting layer. The light source may further include an LED and optionally a light guide panel. The liquid crystal layer disposed between the lower substrate and the layered structure.

Referring to FIG. 3, in a non-limiting embodiment, the display device includes a liquid crystal panel 200, an optical element 300 (e.g. polarizer) disposed on and/or under the liquid crystal panel 200, and a backlight unit including a blue light emitting light source under a lower optical element 300. The backlight unit may include a light source 110 and a light guide 120 (edge type). The backlight unit may be may be a direct lighting without a light guide (not shown). The liquid crystal panel 200 may include a lower substrate 210, a upper substrate 240, and a liquid crystal layer 220 between the upper and lower substrates, and a color filter layer 230 disposed on or under the upper substrate 240. The color filter layer 230 may include the quantum dot-polymer composite (or a pattern thereof).

A wire plate 211 is provided on an internal surface, for example, on the lower substrate 210. The wire plate 211 may include may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

In an embodiment, an upper optical element 300 or an upper polarizer 300 may be provided between the liquid crystal layer 220 and the upper substrate 240, but it is not limited thereto. For example, the upper polarizer 300 may be disposed between the liquid crystal layer 220 (or a common electrode 231) and the light emitting layer (or the quantum dot-polymer composite pattern). A black matrix 241 is provided under the upper substrate (e.g., lower surface thereof) and has an opening and hides a gate line, a data line, and a thin film transistor of a wire plate on the lower substrate. A first color filter (R) emitting red light, a second color filter (G) emitting green light and/or a third color filter (B) for (emitting or transmitting) blue light may be disposed in the opening on the black matrix 241. For example, the black matrix 241 may have a lattice shape. The color filter layer 230 may include a transparent common electrode 231.

If desired, the display device may further include a blue cut filter (hereinafter, also referred to as a first optical filter layer). The blue cut filter may be disposed between bottom surfaces of the first section (R) and the second section (G) and the upper substrate (240) or over a top surface of the upper substrate (240). The blue cut filter may include a sheet with openings that correspond to the third section (e.g., a pixel area showing a blue color) and may be formed on portions corresponding to the first and second sections. The first optical filter layer may be formed as one body structure over the portions other than a portions overlapping the third section, but is not limited thereto. At least two first optical filter layers may be spaced apart and be disposed over each of the positions overlapping the first and the second sections, respectively.

For example, the first optical filter layer may block light having a predetermined wavelength range in the visible light range and transmit light having other wavelength range. For example, the first optical filter layer may block blue light and transmit light other than blue light. For example, the first optical filter layer may transmit green light, red light, or yellow light (e.g., the mixed light of the green and the red ones).

The first optical filter layer may include a polymer thin film including a dye and/or a pigment that absorbs light having a wavelength to be blocked. The first optical filter layer may block at least 80%, or at least 90%, even at least 95% of blue light having a wavelength of less than or equal to about 480 nm; and with respect to the visible light having other wavelengths, it may have a light transmittance of greater than or equal to about 70%, for example, greater than or equal to about 80%, greater than or equal to about 90%, or even up to 100%.

The first optical filter layer may absorb and substantially block blue light having a wavelength of less than or equal to about 500 nm and for example may selectively transmit green light or red light. In this case, at least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light, respectively.

In some embodiments, the first optical filter (layer) may include at least one of a first region and a second region wherein the first region blocks (e.g., absorb) blue light and red light and transmits light having a wavelength of a predetermined to range (e.g., greater than or equal to about 500 nm, greater than or equal to about 510 nm, or greater than or equal to about 515 nm and less than or equal to about 550 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm). The first region may be disposed (directly) on or over a location overlapping a green light emitting section and the second region may be disposed (directly) on or over a location overlapping a red light emitting section. The first region and the second region may be optically isolated for example by a black matrix.

The first optical filter (layer) may contribute to improving color purity of a display device.

The first optical filter layer may be a reflection type fitter including a plurality of layers (e.g., inorganic material layers) with different reflective index. For example, in the first optical layer, two layers having different reflective index may be attematingly stacked with each other. For example, a layer having a high reflective index and a layer having a low reflective index may be alternatingly laminated with each other.

The display device may further include a second optical filter layer (e.g., red/green light or yellow light recycling layer) that is disposed between the light emitting layer and the liquid crystal layer (e.g., between the light emitting layer 230—(e.g., the quantum dot polymer composite layer) and the upper polarizer 300), transmit at least a portion of a third light, and reflect at least a portion of a first light and/or a second light. The second filter layer may reflect light having a wavelength of greater than 500 nm.

The first light may be red light, the second light may be green light, and the third light may be blue light.

Hereinafter, the embodiments are illustrated in more detail with reference to examples. However, they are exemplary embodiments of the present invention, and the present invention is not limited thereto.

EXAMPLES

Measuring Method:
Analysis Method
[1] Photoluminescence Analysis
Hitachi F-7000 spectrometer is used to obtain a photoluminescence spectrum with irradiation light of 458 nanometers (nm) (532 nm for red light emitting quantum dot (QD)).
[2] Photo-Conversion Efficiency (Photo-Conversion Efficiency: CE)
A photo-conversion efficiency of a quantum dot-polymer composite film is determined in the following manner: the obtained quantum dot-polymer composite is inserted between a light guide and an optical sheet of 60-inch TV mounted with a blue LED having a peak wavelength of 449 nm. The obtained TV set is operated and by analyzing the photoluminescent properties with a spectroradiometer (Konica Minolta, CS-2000) disposed in front of about 45 cm, a photoluminescence spectrum of the emitted light is obtained. A photoconversion efficiency (PCE) is calculated from the photoluminescence spectrum.
[3] Sedimentation Stability of Composition
In an example procedure, 50 mL of the composition is placed in a 100 mL measuring cylinder. After 72 hours elapse, whether a substantial phase separation (e.g., a phase separation of greater than or equal to about 2 ml, greater than or equal to about 3 ml, greater than or equal to about 4 ml, or greater than or equal to about 5 mL) occurs is determined by a naked eye observation.
[4] Analysis of a Development Type for a Composite
In an example procedure, the obtained composite film is dipped in a potassium hydroxide solution (concentration: 0.038 wt %, pH:11) for 600 seconds under the agitation, and a state of a developing solution is observed.

When the particles (e.g., particles having a diameter of greater than or equal to about 2 mm, greater than or equal to about 3 mm, greater than or equal to about 4 mm, or greater than or equal to about 5 mm) are observed in the solution by the naked eye after the development, it is referred to a strong delamination type.

When particles (e.g., having a diameter of greater than or equal to 1 mm and less than or equal to 2 mm) are not observed in the solution by naked eyes after the development, but if the pores are clogged when the solution is filtered after the development using a filter having a pore size of 400 um, it is referred to as a slight delamination type.

When there are no particles observed in the solution after the development by the naked eye, and if the pores are not clogged when the solution is filtered after the development using a filter having a pore size of 400 um, it is referred to as a re-dissolution type.

Reference Examples 1 to 3 and Comparative Example 1: Preparation of Metal Oxide Particle Dispersion I Samples were prepared using $TiO_2$ particles (having an average particle diameter of 200 nm, and 20 wt % based on a total weight of dispersion) and three different types of polymers for a first stabilizer (20 wt % based on a total weight of dispersion) as shown in Table 1, and are added into propylene glycol monomethylether acetate (PGMEA) and a ball-milling is conducted for 60 minutes.

TABLE 1

| | Type of first stabilizer | Weight average molecular weight (g/mol) |
|---|---|---|
| Reference Example 1 | Carboxylic acid group-containing vinyl copolymer (A) | about 3000 |
| Reference Example 2 | Acrylate copolymer (B) | about 3000 |
| Reference Example 3 | Polyester (C) | about 3000 |
| Comparative Example 1 | Not using a dispersing agent | — |

The states of the obtained particle dispersions are monitored after 72 hours. The results show that in case of where the particles are surface-treated with a carboxylic acid group-containing vinyl copolymer (A) or an acrylate copolymer (B), they maintain their dispersed states but there occurs a slight sedimentation phenomenon at an upper surface of the liquid. In case where the particles are surface-treated with polyester (C), the dispersed state is maintained without the sedimentation on the upper surface of the liquid.

In the case of Comparative Example 1 using no first stabilizer as a dispersing agent, most of particles are precipitated after 72 hours and it becomes Impossible to form a dispersion. Preparation Examples 1 to 11: Preparation of Metal oxide particle Dispersion II $TIO_2$ particles (having an average particle diameter of 200 nm and 20 wt % based on a total weight of dispersion) are added into propylene glycol monomethylether acetate (PG-MEA), and a first stabilizer (C) used in Reference Example 3 (in an amount of 2 wt % based on a total weight of a dispersion) and a second stabilizer (i.e., a copolymer of (meth)acrylate and acrylic acid (or a derivative thereof) each having the properties (weight average molecular weight and acid values as set forth in Table 2)), in an amount of 5 wt % based on a total weight of dispersion, are simultaneously or sequentially added thereto and a ball-milling is conducted for 60 minutes.

The states of the obtained particle dispersions are monitored after 72 hours. The results show that the dispersed state is maintained without sedimentation on an upper surface of the liquid.

TABLE 2

|  | Weight average molecular weight (g/mol) | Acid value (mg KOH/gram) |
| --- | --- | --- |
| Preparation Example 1 | 5000 | 103 |
| Preparation Example 2 | 6700 | 114 |
| Preparation Example 3 | 6400 | 115 |
| Preparation Example 4 | 3600 | 101 |
| Preparation Example 5 | 5500 | 110 |
| Preparation Example 6 | 5000 | 156 |
| Preparation Example 7 | 4500 | 90 |
| Preparation Example 8 | 5400 | 119 |
| Preparation Example 9 | 11000 | 100 |
| Preparation Example 10 | 10000 | 130 |
| Preparation Example 11 | 6700 | 150 |

Example 1

[1] Preparation of Quantum Dot-Binder Dispersion

A chloroform dispersion of quantum dots (InP/ZnS core shell having oleic acid as an organic ligand on a surface thereof, red light emitting) is prepared. The prepared quantum dot chloroform dispersion is mixed with a binder (a quaternary copolymer of methacrylic acid, benzyl methacrylate, hydroxyethylmethacrylate, and styrene, having an acid value of 130 mg KOH/g, a weight average molecular weight of 8000 g/mol, and a mole percentage ratio of methacrylic acid:benzylmethacrylate:hydroxyethylmethacrylate:styrene of 61.5%:12%:16.3%:10.2%) solution (propylene glycol monomethylether acetate having a concentration of 30 wt %) to provide a quantum dot-binder dispersion. Observation by naked eye confirms that quantum dots are uniformly dispersed in the quantum dot-binder dispersion.

[2] Preparation of Composition

Glycol di-3-mercaptopropionate (hereinafter, 2T) having the following chemical structure, a polymerizable monomer of dipentaerythritol hexaacrylate having the following structure, an oxime ester compound initiator, the metal oxide particle dispersion obtained from Preparation Example 1, and PGMEA are mixed with the obtained quantum dot binder dispersion, to provide a composition (total solid content of composition: 25%).

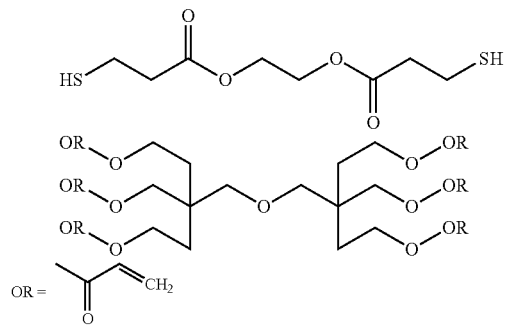

The obtained composition includes 40 wt % of quantum dots, 12.5 wt % of the binder, 12 wt % of the photopolymerizable monomer, 0.5 wt % of the initiator, 10 wt % of the surface-treated metal oxide particle, and 25 wt % of the multi-thiol compound based on the total amount of the solid material.

It is confirmed that the obtained composition forms a dispersion without any noticeable agglomeration. For the obtained composition, evaluation of sedimentation stability is made. It is confirmed that all of the obtained compositions do not show any substantial phase-separation after 72 hours.

[3] Production of Quantum Dot-Polymer Composite Patter

The prepared composition is spin-coated on a glass substrate at 180 rpm for seconds to obtain a film. The obtained film is pre-baked at 100° C. A photo-conversion efficiency of the pre-baked film is measured, and the results are shown in Table 3. The pre-baked film is irradiated with light (at a wavelength of 365 nm and intensity of 100 milliJoules (mJ)) under a mask having a predetermined pattern for 1 second and developed by a potassium hydroxide aqueous solution (at a concentration of 0.043 wt % and a pH of 11) for 50 seconds to provide a pattern (having a line width of 100 µm). When the obtained pattern is irradiated with blue light (at a wavelength 450 nm), it is confirmed that red light is emitted from the pattern.

In the developing process, a development type is determined with naked eyes and a filtering, and the results are compiled in Table 4.

[4] Evaluation of Photoluminescence Stability According to Post Baking Treatment The obtained patterns are heated at 180° C. for each 30 minutes for one time, and a photo-conversion efficiency is measured in each case, and the results are shown in Table 3.

Examples 2 to 11

Quantum dot-polymer composite patterns of Examples 2 to 8 are obtained in the same manner as in Example 1, except for using the metal oxide particle dispersions obtained from Preparation Examples 2 to 8, respectively.

Quantum dot-polymer composite patterns of Examples 9 to 11 are obtained in the same manner as in Example 1, except for using the metal oxide particle dispersions obtained from Preparation Examples 9 to 10, respectively. The obtained composition includes 43 wt % of the quantum dot, 8.5 wt % of the binder, 8 wt % of the photopolymerizable monomer, 0.5 wt % of the initiator, 15 wt % of the surface-treated metal oxide particle, and 25 wt % of the multi-thiol compound based on the total amount of the solid material.

It is confirmed that the obtained composition forms a dispersion without any noticeable agglomeration phenomenon. For the obtained composition, evaluation of the sedimentation stability is carried out. It is confirmed that all of the obtained compositions do not show any substantial phase-separation after 72 hours.

A photo-conversion efficiency of the pre-baked film is measured, and the results are shown in Table 3. The obtained pattern is heated at 180° C. for 30 minutes for one time, and the photo-conversion efficiency is measured at each case, and the results are shown in Table 3 below.

In the developing process, a development type is determined with naked eyes and a filtering, and the results are compiled in Table 4 below.

Comparative Example 2

A quantum dot-polymer composite pattern is obtained in the same manner as in Example 1, except that the metal oxide particle dispersion having only a first stabilizer obtained from Reference Example 1 is used.

It is confirmed that the obtained composition forms a dispersion without any noticeable agglomeration phenomenon. For the obtained composition, the sedimentation stability is evaluated. It is confirmed that the obtained composition does not show any substantial phase-separation after 72 hours.

A photo-conversion efficiency of the pre-baked film is measured, and the results are shown in Table 3. The obtained pattern is heated at 180° C. for 30 minutes for one time, and in each case, the photo-conversion efficiency is measured, and the results are shown in Table 3.

In the developing process, a development type is determined with naked eye and a filtering, and the results are compiled in Table 4.

Comparative Example 3

A quantum dot-polymer composite pattern is obtained in the same manner as in Example 1, except that a metal oxide particle (average particle size of 200 nm, the surface is treated with an amine compound) is used.

It is confirmed that the obtained composition forms a dispersion without the outstanding agglomeration phenomenon. The obtained composition is evaluated for a sedimentation stability. It is confirmed that the obtained composition shows a substantial phase-separation after 72 hours.

A photo-conversion efficiency of the pre-baked film is measured, and the results are shown in Table 3. The obtained pattern is heated at 180° C. for 30 minutes for two times, and the photo-conversion efficiency is measured in each case, and the results are shown in Table 3.

In the developing process, a development type is determined by naked eye and a filtering, and the results are compiled in Table 4.

TABLE 3

|  | Pre-bake (PrB) PCE (%) | Post-bake (PoB) PCE (%) | Photo-conversion maintenance rate (PoB PCE/PrB PCE) (%) |
|---|---|---|---|
| Example 1 | 31 | 28 | 92 |
| Example 2 | 31 | 29 | 91 |
| Example 3 | 31 | 28 | 91 |
| Example 4 | 31 | 27 | 88 |
| Example 5 | 31 | 27 | 87 |
| Example 6 | 31 | 29 | 93 |
| Example 7 | 31 | 27 | 87 |
| Example 8 | 31 | 27 | 87 |
| Example 9 | 33 | 28 | 87 |
| Example 10 | 34 | 29 | 86 |
| Example 11 | 33 | 29 | 88 |
| Comparative Example 2 | 31 | 27 | 88 |
| Comparative Example 3 | 27.1 | 15 | 53.1 |

From the results shown in Table 3, it is confirmed that the composites of Examples 1 to 11 may exhibit significantly enhanced photo-conversion rates and maintenance rates compared to Comparative Example 3 including the conventional metal oxide particles commercially available in the market. It is confirmed that the composites of Examples 1 to 11 may exhibit photo-conversion rates and maintenance rates comparable to the case using the metal oxide particle including only first stabilizer.

TABLE 4

|  | Delamination type |
|---|---|
| Example 1 | Re-dissolution |
| Example 2 | Re-dissolution |
| Example 3 | Re-dissolution |
| Example 4 | Strong delamination |
| Example 5 | Re-dissolution |
| Example 6 | Slight delamination |
| Example 7 | Strong delamination |
| Example 8 | Re-dissolution |
| Example 9 | Re-dissolution (partial delamination) |
| Example 10 | Re-dissolution |
| Example 11 | Re-dissolution |
| Comparative Example 2 | Strong delamination |
| Comparative Example 3 | Strong delamination |

From the results shown in Table 4, it is confirmed that the composites of Examples 1 to 11 may exhibit improved developability compared to the composites of Comparative Example 3 including the conventional metal oxide particle commercially available in the market. It is also confirmed that the composites obtained from Examples 1 to 3, 5, 6, 9 to 11 may exhibit improved developability compared to the case of using the metal oxide particle including only the first stabilizer.

Example 2-1

A quantum dot-polymer composite pattern is obtained in the same manner as in Example 2, except using a substrate that a thiolene polymer is coated on a glass substrate. It is confirmed that it is developed in a re-dissolution type on the developing process.

Example 3-1

A quantum dot-polymer composite pattern is obtained in the same manner as in Example 3, except using a substrate that a thiolene polymer is coated on a glass substrate. It is confirmed that it is developed in a re-dissolution type on the developing process.

Example 11-1

A quantum dot-polymer composite pattern is obtained in the same manner as in Example 11, except using a substrate that a polymethylmethacrylate is coated on a glass substrate. It is confirmed that it is developed in a re-dissolution type on the developing process.

While this disclosure has been described in connection with what is presently considered to be practical example embodiments, it is to be understood that the disclosure is not limited to the exemplary embodiments, but, on the contrary, is intended to cover various modifications and equivalent arrangements included within the spirit and scope of the appended claims.

What is claimed is:
1. A composition, comprising:
   a plurality of metal oxide particles comprising a first stabilizer and a second stabilizer on a surface thereof;
   a plurality of quantum dots;
   a binder polymer comprising a carboxylic acid group;
   a polymerizable monomer comprising a carbon-carbon double bond;
   an initiator;
   optionally a multi-thiol compound comprising at least two thiol groups; and a solvent,
wherein the first stabilizer comprises a first polymer comprising
a repeating unit of the formula —RO— wherein R is a C1 to C5 alkylene group,
—$R_1$COO— wherein $R_1$ is a C1 to C30 substituted or unsubstituted alkylene group, a C6 to C20 substituted or unsubstituted arylene group, a C6 to C30 substituted or unsubstituted cycloalkylene group, or a combination thereof,
—$CR_1R_2$—CAR— wherein A is a hydrogen atom, —COOH, or —COOR and wherein R, $R_1$, and $R_2$ are independently a hydrogen atom, a C1 to C10 substituted or unsubstituted alkyl group, or a combination thereof,
—OCONH—R—NHCOO—R'— wherein R and R' are independently a C1 to C30 substituted or unsubstituted alkylene group, a C6 to C20 substituted or unsubstituted arylene group, a C6 to C30 substituted or unsubstituted cycloalkylene group, or a combination thereof,
or a combination thereof, and
the second stabilizer comprises a second polymer comprising a main chain, wherein the second polymer comprises
a polymer comprising substituted or unsubstituted alkylene groups having a carboxylic acid group in the main chain,
a multiple aromatic ring-containing polymer comprising a carboxylic acid group (—COOH) and having a backbone structure wherein two aromatic rings are bound to a quaternary carbon atom being a constituent atom of another cyclic moiety in the main chain,
or a combination thereof.

2. The composition of claim 1, wherein the metal oxide particle comprises a titanium oxide, a silicon oxide, a barium oxide, a zinc oxide, or a combination thereof.

3. The composition of claim 2, wherein the metal oxide particle comprises $TiO_2$, $SiO_2$, $BaTiO_3$, $Ba_2TiO_4$, ZnO, $ZrO_2$, or a combination thereof.

4. The composition of claim 1, wherein an average particle size of the metal oxide particle is greater than or equal to about 30 nanometers and less than or equal to about 1000 nanometers.

5. The composition of claim 4, wherein the average particle size of the metal oxide particle is greater than or equal to about 100 nanometers and less than or equal to about 500 nanometers.

6. The composition of claim 1, wherein the first stabilizer has a weight average molecular weight of about 100 grams per mole to about 7000 grams per mole.

7. The composition of claim 1, wherein the first stabilizer comprises a poly(C1 to C5 alkylene oxide), a polyester, a polyurethane, a poly((C1 to C10 alkyl) (meth)acrylate), or a combination thereof.

8. The composition of claim 1, wherein the second stabilizer comprises a copolymer comprising:
a first repeating unit comprising alkylene substituted with the carboxylic acid group; and
a second repeating unit comprising alkylene substituted with a (C1 to C15 alkyl) ester group, a (C7 to C13 arylalkyl) ester group, a (C6 to C12 aryl) ester group, or a combination thereof.

9. The composition of claim 1, wherein the second stabilizer comprises a polymerization product of a monomer combination comprising a first monomer that is (meth)acrylic acid, fumaric acid, maleic acid, crotonic acid, ethyl acrylic acid, or a combination thereof; and a second monomer that is a (C1 to C15 alkyl) (meth)acrylate, a (C7 to C13 arylalkyl) (meth)acrylate, or a (C6 to C12 aryl) (meth)acrylate.

10. The composition of claim 1, wherein the second polymer of the second stabilizer has an acid value of greater than or equal to about 90 milligrams of KOH per gram and a weight average molecular weight of greater than or equal to about 3600 grams per mole.

11. The composition of claim 10, wherein the second polymer of the second stabilizer has an acid value of about 100 milligrams of KOH per gram to about 200 milligrams of KOH per gram and a weight average molecular weight of about 5000 grams per mole to about 20000 grams per mole.

12. The composition of claim 1, wherein the first stabilizer and the second stabilizer are bound to the surface of the metal oxide particle.

13. The composition of claim 1, wherein the quantum dot comprises a Group II-VI compound, a Group III-V compound, a Group IV-VI compound, a Group IV element or compound, a Group II-III-VI compound, a Group I-II-IV-VI compound, or a combination thereof.

14. The composition of claim 1, wherein the binder polymer comprises
a copolymer of a monomer combination comprising a first monomer comprising a carboxylic acid group and a carbon-carbon double bond, a second monomer comprising a carbon-carbon double bond and a hydrophobic moiety and not comprising a carboxylic acid group, and optionally a third monomer comprising a carbon-carbon double bond and a hydrophilic moiety and not comprising a carboxylic acid group;
a multiple aromatic ring-containing polymer comprising a carboxylic acid group (—COOH) and having a backbone structure wherein two aromatic rings are bound to a quaternary carbon atom being a constituent atom of another cyclic moiety in a main chain; or
a combination thereof.

15. The composition of claim 1, wherein the binder polymer has an acid value of greater than or equal to about 50 milligrams of KOH per gram and less than or equal to about 240 milligrams of KOH per gram.

16. The composition of claim 1, wherein in the composition, an amount of the plurality of quantum dots is greater than or equal to about 20 weight percent and an amount of the plurality of metal oxide particles is greater than or equal to about 5 weight percent, each based on a total weight of solid contents of the composition.

17. A quantum dot-polymer composite prepared by polymerization of the composition according to claim 1,
wherein a solution obtained by dipping the quantum dot-polymer composite in an alkali aqueous solution does not block a pore of a filter having a pore size of greater than or equal to about 400 micrometers when filtering the solution through the filter.

18. A layered structure, comprising
a substrate; and
an emissive layer disposed on the substrate,
wherein the emissive layer comprises a pattern of a quantum dot-polymer composite,
the pattern of the quantum dot-polymer composite comprises at least one repeating section that emits a first light,
the quantum dot-polymer composite comprises a polymer matrix, wherein a plurality of quantum dots and a plurality of metal oxide particles are dispersed in the polymer matrix, the metal oxide particles comprise a first stabilizer and a second stabilizer on a surface thereof, the first stabilizer comprises a first polymer comprising a repeating unit of the formula —RO— wherein R is a C1 to C5 alkylene group, —$R_1$COO— wherein $R_1$ is a C1 to C30 substituted or unsubstituted alkylene group, a C6 to C20 substituted or unsubstituted arylene group, a C6 to C30 substituted or unsubstituted cycloalkylene group, or a combination thereof, —C$R_1R_2$—CAR— wherein A is a hydrogen atom, —COOH, or —COOR and wherein R, $R_1$, and $R_2$ are independently a hydrogen atom, a C1 to C10 substituted or unsubstituted alkyl group, or a combination thereof, —OCONH—R—NHCOO—R'— wherein R and R' are independently a C1 to C30 substituted or unsubstituted alkylene group, a C6 to C20 substituted or unsubstituted arylene group, a C6 to C30 substituted or unsubstituted cycloalkylene group, or a combination thereof, or a combination thereof, and the second stabilizer comprises a second polymer comprising a main chain, comprising
- a polymer comprising substituted or unsubstituted alkylene groups having a carboxylic acid group in the main chain,
- a multiple aromatic ring-containing polymer comprising a carboxylic acid group (—COOH) and having a backbone structure wherein two aromatic rings are bound to a quaternary carbon atom being a constituent atom of another cyclic moiety in the main chain, or
- a combination thereof.

19. The layered structure of claim 18, wherein at least a portion of the substrate cut blue light.

20. The layered structure of claim 18, wherein the polymer matrix comprises a cross-linked polymer and a binder polymer comprising a carboxylic acid group.

21. The layered structure of claim 20, wherein the cross-linked polymer comprises a thiolene polymer, a cross-linked poly(meth)acrylate, or a combination thereof.

22. The layered structure of claim 18, wherein the metal oxide particle comprises a titanium oxide, a silicon oxide, a barium oxide, a zinc oxide, or a combination thereof.

23. The layered structure of claim 18, wherein an average particle size of the metal oxide particle is be greater than or equal to about 100 nanometers and less than or equal to about 500 nanometers.

24. The layered structure of claim 18, wherein the first polymer of the first stabilizer comprises a poly(C1 to C5 alkylene oxide), a polyester, a polyurethane, a poly(C1 to C10 alkyl(meth)acrylate), or a combination thereof, the first polymer of the first stabilizer has a weight average molecular weight of about 100 grams per mole to about 7,000 grams per mole, and the second polymer of the second stabilizer has an acid value of greater than or equal to about 100 milligrams of KOH per gram and a weight average molecular weight of greater than or equal to about 5,000 grams per mole.

25. A display device, comprising:
a light source; and
a light emitting element comprising the layered structure of claim 18,
wherein the light source is configured to provide incident light to the emissive layer of the layered structure.

* * * * *